US012757377B2

(12) United States Patent
Su

(10) Patent No.: US 12,757,377 B2
(45) Date of Patent: *Oct. 6, 2026

(54) MEMORY DEVICE HAVING IMPROVED P—N JUNCTION AND MANUFACTURING METHOD THEREOF

(71) Applicant: NANYA TECHNOLOGY CORPORATION, New Taipei City (TW)

(72) Inventor: Kuo-Hui Su, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 375 days.

This patent is subject to a terminal disclaimer.

(21) Appl. No.: 18/398,239

(22) Filed: Dec. 28, 2023

(65) Prior Publication Data

US 2025/0194075 A1 Jun. 12, 2025

Related U.S. Application Data

(62) Division of application No. 18/531,966, filed on Dec. 7, 2023.

(51) Int. Cl.
*H10B 12/00* (2023.01)
*H10D 62/10* (2025.01)
(Continued)

(52) U.S. Cl.
CPC ........... *H10B 12/315* (2023.02); *H10B 12/03* (2023.02); *H10B 12/30* (2023.02); *H10B 12/482* (2023.02);
(Continued)

(58) Field of Classification Search
CPC ...... H10B 12/315; H10B 12/03; H10B 12/30; H10B 12/482; H10B 12/053;
(Continued)

(56) References Cited

U.S. PATENT DOCUMENTS

2008/0113478 A1 5/2008 Beigel et al.
2008/0197442 A1* 8/2008 Hirler .................. H10D 12/481
438/587
(Continued)

FOREIGN PATENT DOCUMENTS

TW 201801321 A 1/2018
TW 202036787 A 10/2020
(Continued)

OTHER PUBLICATIONS

Office Action and and the search report mailed on Jun. 4, 2025 related to Taiwanese Application No. 113121472.
(Continued)

*Primary Examiner* — Omar F Mojaddedi
(74) *Attorney, Agent, or Firm* — Xuan Zhang

(57) ABSTRACT

The present disclosure provides a memory device having improved P-N junction and a manufacturing method thereof. The memory device includes a semiconductor substrate having a first surface and defined with an active area under the first surface, a gate structure adjacent to the active area and indented into the semiconductor substrate from the first surface, a doped member extending into the semiconductor substrate and surrounded by the active area, a conductive layer including a first portion extending into the semiconductor substrate from the first surface and a second portion disposed over the doped member and coupled to the first portion, a first insulating layer disposed adjacent to the first portion of the conductive layer and between the doped member and the active area of the semiconductor substrate, a first contact disposed over the conductive layer, and a conductive pillar disposed over the first contact.

10 Claims, 25 Drawing Sheets

(51) Int. Cl.
*H10D 62/17* (2025.01)
*H10D 64/27* (2025.01)

(52) U.S. Cl.
CPC ......... *H10D 62/102* (2025.01); *H10D 62/343* (2025.01); *H10D 64/517* (2025.01)

(58) Field of Classification Search
CPC ............. H10B 12/0335; H10D 62/343; H10D 30/668; H10D 30/0281; H10D 30/0297; H10D 30/665; H10D 64/517; H10W 20/072; H10W 20/46; H10W 20/069
See application file for complete search history.

(56) References Cited

U.S. PATENT DOCUMENTS

| | | | | |
|---|---|---|---|---|
| 2009/0020808 | A1* | 1/2009 | Yu | H10B 12/053 257/334 |
| 2013/0168760 | A1* | 7/2013 | Hsieh | H10D 30/668 438/270 |
| 2015/0325597 | A1 | 11/2015 | Zhang | |
| 2015/0333176 | A1* | 11/2015 | Bian | H10D 30/668 438/270 |
| 2017/0148810 | A1 | 5/2017 | Kai et al. | |
| 2020/0258897 | A1 | 8/2020 | Yan et al. | |
| 2021/0296319 | A1 | 9/2021 | Sukekawa | |
| 2021/0335792 | A1* | 10/2021 | Su | H10B 12/0335 |
| 2022/0319567 | A1 | 10/2022 | Thomas et al. | |
| 2022/0352179 | A1 | 11/2022 | Yang et al. | |
| 2023/0246064 | A1 | 8/2023 | Mukherjee et al. | |
| 2026/0068239 | A1* | 3/2026 | Chowdhury | H10D 30/662 |

FOREIGN PATENT DOCUMENTS

| | | | |
|---|---|---|---|
| TW | 202105691 | A | 2/2021 |
| TW | 202125723 | A | 7/2021 |
| TW | 202135295 | A | 9/2021 |
| TW | 202218128 | A | 5/2022 |
| TW | 202240793 | A | 10/2022 |
| TW | 202240854 | A | 10/2022 |
| TW | 202343545 | A | 11/2023 |
| TW | 202343685 | A | 11/2023 |
| TW | 202343737 | A | 11/2023 |

OTHER PUBLICATIONS

Summary translation of Office Action and and the search report mailed on Jun. 4, 2025 related to Taiwanese Application No. 113121472.
Office Action and and the search report mailed on Jan. 20, 2025 related to Taiwanese Application No. 113105266.
Summary translation of Office Action and and the search report mailed on Jan. 20, 2025 related to Taiwanese Application No. 113105266.

* cited by examiner

MEMORY DEVICE HAVING IMPROVED P—N JUNCTION AND MANUFACTURING METHOD THEREOF

CROSS-REFERENCE TO RELATED APPLICATION

This application is a divisional application of U.S. Non-Provisional application Ser. No. 18/531,966 filed Dec. 7, 2023, which is incorporated herein by reference in its entirety.

TECHNICAL FIELD

The present disclosure relates to a memory device and a manufacturing method thereof, and more particularly, to a memory device having an insulating layer and a conductive layer corresponding to the insulating layer to form a channeled P-N junction, and a manufacturing method of the memory device.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a P-N junction is reduced to a few nanometers in length, an undesired conduction within the P-N junction may significantly decrease performance of the DRAM. It is therefore desirable to avoid P-N junction leakage.

SUMMARY

One aspect of the present disclosure provides a memory device. The memory device includes a semiconductor substrate having a first surface and defined with an active area under the first surface; a gate structure adjacent to the active area and indented into the semiconductor substrate from the first surface; a doped member extending into the semiconductor substrate and surrounded by the active area; a conductive layer including a first portion extending into the semiconductor substrate from the first surface and a second portion disposed over the doped member and coupled to the first portion; a first insulating layer disposed adjacent to the first portion of the conductive layer and between the doped member and the active area of the semiconductor substrate; a first contact disposed over the conductive layer and surrounded by a first dielectric layer; and a conductive pillar disposed over the first contact and disposed between the first contact and a capacitor, wherein the first portion of the conductive layer is disposed between the gate structure and the doped member.

Another aspect of the present disclosure provides a memory device. The memory device includes a semiconductor substrate defined with a first active area and a second active area; a gate structure adjacent to the first and second active areas and indented into the semiconductor substrate from a first surface of the semiconductor substrate; a doped member extending into the semiconductor substrate and surrounded by the first active area; a conductive layer including a first portion extending into the semiconductor substrate from the first surface of the semiconductor substrate and a second portion disposed over the doped member and coupled to the first portion; a first insulating layer disposed adjacent to the first portion of the conductive layer and between the doped member and the first active area of the semiconductor substrate, and a second insulating layer disposed over the gate structure, wherein the first insulating layer and the second insulating layer are separated from each other; a first contact and a second contact disposed over the conductive layer and surrounded by a first dielectric layer; and a first conductive pillar and a second conductive pillar disposed over the first dielectric layer, wherein the first portion of the conductive layer is disposed between the gate structure and the doped member.

Another aspect of the present disclosure provides a method for preparing a memory device. The method includes steps of providing a semiconductor substrate defined with an active area, wherein the semiconductor substrate includes a gate structure adjacent to the active area and an isolation structure surrounding the active area and the gate structure; forming a recess extending into the semiconductor substrate and within the active area; and forming an insulating layer conformal to the recess. The method further includes removing a portion of the insulating layer to expose a first side of the recess, wherein the first side of the recess is adjacent to the gate structure; forming a first portion of a conductive layer on the first side of the recess; forming a doped member within the recess and over the insulating layer and the first portion of the conductive layer; forming a second portion of the conductive layer over the doped member and coupled to the first portion of the conductive layer; forming a first contact over the second portion of the conductive layer; performing an etching process to form a conductive pillar over the first contact and a landing pad over the conductive pillar; and forming a second contact over the landing pad and a capacitor over the second contact.

In conclusion, because an insulating layer disposed between a doped member and an active area of a semiconductor substrate is coupled to a conductive layer adjacent to a gate structure and over the doped member, leakage from a P-N junction may be avoided. Therefore, an overall performance of a memory device and a process of manufacturing the memory device are improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for conducting the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
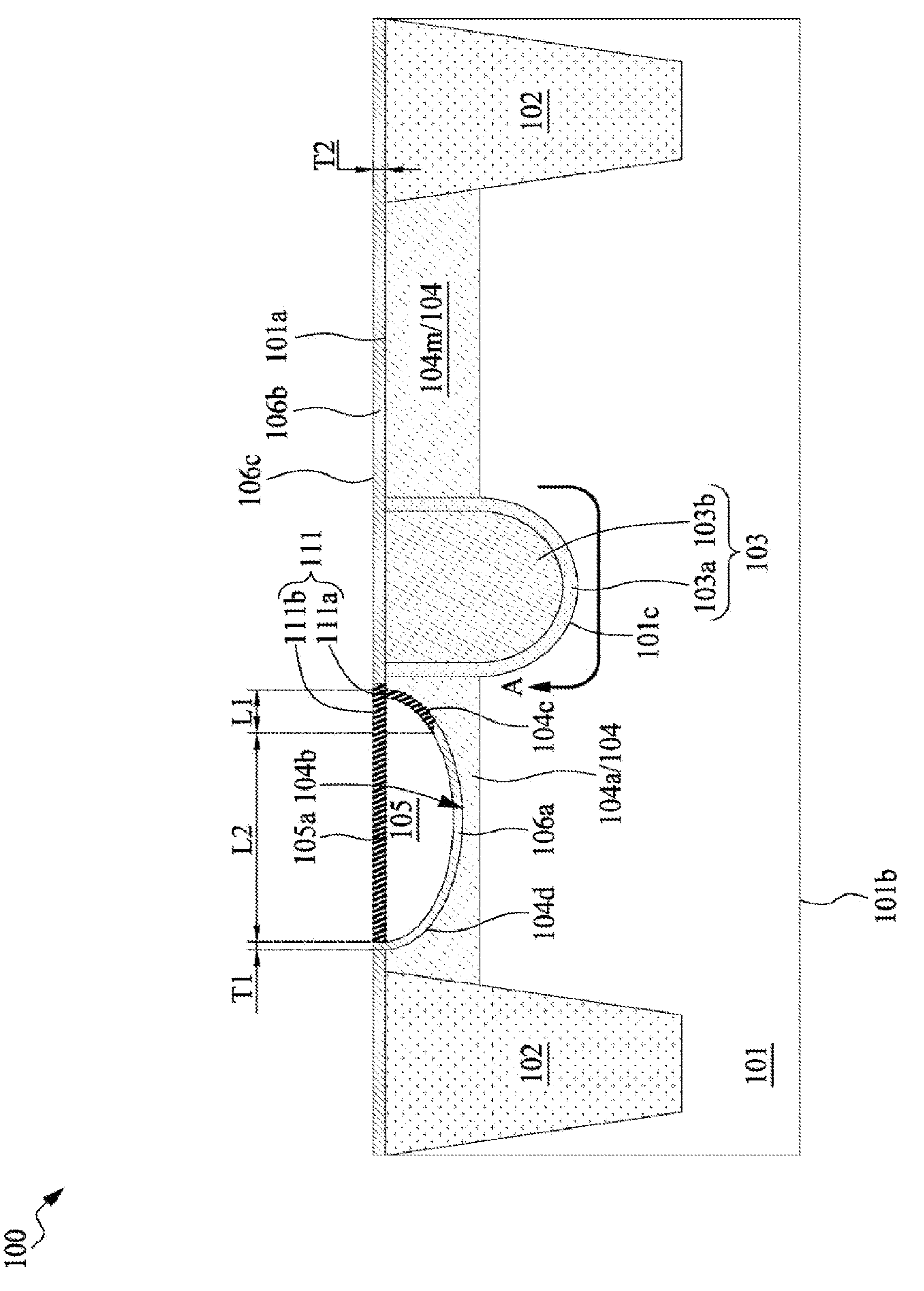
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a first memory device 100 in accordance with some embodiments of the present disclosure. In some embodiments, the first memory device 100 includes several unit cells.

In some embodiments, the first memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes a first surface **101*a* and a second surface 101*b* opposite to the first surface 101*a*. In some embodiments, the first surface 101*a* is a front side of the semiconductor substrate 101, wherein electrical devices or components are subsequently formed over the first surface 101*a* and configured to electrically connect to an external circuitry. In some embodiments, the second surface 101*b* is a back side of the semiconductor substrate 101**, wherein electrical devices or components are absent.

In some embodiments, the semiconductor substrate 101 includes several active areas (AA) 104 separated from each other. Each of the active areas 104 is a doped region in the semiconductor substrate 101. In some embodiments, each of the active areas 104 extends horizontally over or under the first surface **101*a* of the semiconductor substrate 101. In some embodiments, each of the active areas 104 includes a same type of dopant. In some embodiments, each of the active areas 104 includes a type of dopant that is different from types of dopants included in other active areas 104. In some embodiments, each of the active areas 104 has a same conductive type. In some embodiments, the active area 104** includes N-type dopants.

In some embodiments, the semiconductor substrate 101 includes a first recess **101*c* extending into the semiconductor substrate 101. In some embodiments, the first recess 101*c* extends from the first surface 101*a* toward the second surface 101*b* of the semiconductor substrate 101. In some embodiments, the first recess 101*c* is disposed between the active areas 104, such as between a first active area 104*a* and a second active area 104*m*. In some embodiments, the first recess 101*c* is tapered from the first surface 101*a* toward the second surface 101*b* of the semiconductor substrate 101. In some embodiments, a depth of the first recess 101*c* is substantially greater than a depth of each of the active areas 104**.

In some embodiments, the first memory device 100 includes a gate structure 103 disposed within the first recess **101*c*. In some embodiments, the gate structure 103 is disposed between the active areas 104, such as between the first active area 104*a* and the second active area 104*m***.

In some embodiments, the gate structure 103 includes a gate oxide **103*a*, disposed within the first recess 101*c*, and a gate electrode 103*b* surrounded by the gate oxide 103*a*. In some embodiments, the gate oxide 103*a* is disposed conformal to and within the first recess 101*c*. In some embodiments, the gate oxide 103*a* is disposed along an entire sidewall of the first recess 101*c*. In some embodiments, the gate electrode 103*b* is conformal to the gate oxide 103*a*. In some embodiments, the gate oxide 103*a* includes silicon oxide, or the like. In some embodiments, the gate electrode 103*b*** includes conductive material such as tungsten (W).

In some embodiments, the first memory device 100 further includes an isolation structure 102 adjacent to the gate structure 103. In some embodiments, the isolation structure 102 extends into the semiconductor substrate 101 from the first surface **101*a* toward the second surface 101*b*. In some embodiments, the isolation structure 102 is a shallow trench isolation (STI). In some embodiments, the isolation structure 102 defines a boundary of the active areas 104. In some embodiments, the semiconductor substrate 101 is defined with the active areas 104 and includes the isolation structure 102 surrounding the active areas 104 and the gate structure 103. In some embodiments, the isolation structure 102 is formed of an insulating material, such as silicon oxide, silicon nitride, silicon oxynitride, the like, or a combination thereof. In some embodiments, a depth of the isolation structure 102 is substantially greater than a depth of the gate structure 103**.

In some embodiments, the semiconductor substrate 101 includes a second recess 104*b* extending into the semiconductor substrate 101. In some embodiments, the second recess 104*b* is adjacent to the gate structure 103. In some embodiments, the second recess 104*b* extends from the first surface 101*a* toward the second surface 101*b* of the semiconductor substrate 101. In some embodiments, the second recess 104*b* is tapered from the first surface 101*a* toward the second surface 101*b* of the semiconductor substrate 101. In some embodiments, the second recess 104*b* is disposed within one of the active areas 104, such as the first active area 104*a*. In some embodiments, the second recess 104*b* is disposed between the gate structure 103 and the isolation structure 102. In some embodiments, a depth of the second recess 104*b* is substantially equal to or less than the depth of the first recess 101*c*. In some embodiments, the depth of the second recess 104*b* is less than the depth of the first recess 101*c*. In some embodiments, the second recess 104*b* has a first side 104*c* adjacent to the gate structure 103 and a second side 104*d* opposite to the first side 104*c*.

In some embodiments, the first memory device 100 includes a first insulating layer 106*a* disposed within the second recess 104*b*. In some embodiments, the first side 104*c* of the second recess 104*b* is exposed through the first insulating layer 106*a*. In some embodiments, the first insulating layer 106*a* is conformal to the second side 104*d* of the second recess 104*b*. In some embodiments, the first insulating layer 106*a* is disposed within and surrounded by the first active area 104*a*. In some embodiments, the first insulating layer 106*a* is disposed within the first active area 104*a* and over the isolation structure 102 adjacent to the second recess 104*b*. In some embodiments, the first insulating layer 106*a* includes oxide. In some embodiments, the first insulating layer 106*a* includes silicon oxide, or the like.

In some embodiments, the first memory device 100 includes a doped member 105 extending into the semiconductor substrate 101 and surrounded by the first active area 104*a*. In some embodiments, the doped member 105 is disposed within the second recess 104*b*. In some embodiments, the doped member 105 is disposed over the first insulating layer 106*a*. In some embodiments, the first insulating layer 106*a* is disposed under the doped member 105 and surrounded by the first active area 104*a*. In some embodiments, the doped member 105 is disposed between the isolation structure 102 and the gate structure 103.

In some embodiments, the doped member 105 includes polycrystalline silicon (polysilicon). In some embodiments, the doped member 105 includes a type of dopant that is same as the types of dopants included in the active areas 104. In some embodiments, the doped member 105 includes N-type dopants.

In some embodiments, the first memory device 100 includes a conductive layer 111. In some embodiments, the conductive layer 111 is disposed over the first active area 104*a*. In some embodiments, the conductive layer 111 covers the first active area 104*a*. In some embodiments, the conductive layer 111 is disposed between the gate structure 103 and the isolation structure 102. In some embodiments, the conductive layer 111 is disposed over the doped member 105. In some embodiments, the doped member 105 is surrounded by the first insulating layer 106*a* and the conductive layer 111. In some embodiments, the conductive layer 111 includes conductive material, such as metal or alloy. In some embodiments, the conductive layer 111 includes cobalt.

In some embodiments, the conductive layer 111 includes a first portion 111*a* extending into the first active area 104*a* of the semiconductor substrate 101 from the first surface 101*a*, and a second portion 111*b* disposed over the doped member 105 and coupled to the first portion 111*a*. The first portion 111*a* is coupled to and extends from the second portion 111*b*. In some embodiments, the first portion 111*a* of the conductive layer 111 is substantially orthogonal to the second portion 111*b* of the conductive layer 111.

In some embodiments, the first portion 111*a* and the second portion 111*b* are integral. In some embodiments, the first portion 111*a* and the second portion 111*b* are formed simultaneously or separately. In some embodiments, the formation of the first portion 111*a* is performed prior to the formation of the second portion 111*b*. The conductive materials included in the first portion 111*a* and the second portion 111*b* may be same or different.

In some embodiments, the first portion 111*a* of the conductive layer 111 is disposed between the gate structure 103 and the doped member 105. In some embodiments, the first portion 111*a* of the conductive layer 111 is disposed between the first active area 104*a* and the doped member 105. In some embodiments, the first portion 111*a* of the conductive layer 111 extends into the first active area 104*a* of the semiconductor substrate 101 from the first surface 101*a*. In some embodiments, the first portion 111*a* of the conductive layer 111 is disposed within the first active area 104*a*. In some embodiments, the first portion 111*a* of the conductive layer 111 is disposed within the second recess 104*b*. In some embodiments, the first portion 111*a* of the conductive layer 111 is in contact with the doped member 105.

In some embodiments, the first portion 111*a* of the conductive layer 111 is disposed adjacent to the first insulating layer 106*a*. In some embodiments, the first portion 111*a* of the conductive layer 111 is coupled to the first insulating layer 106*a*. In some embodiments, the first portion 111*a* of the conductive layer 111 is disposed on the first side 104*c* of the second recess 104*b*. In some embodiments, the first portion 111*a* of the conductive layer 111 contacts the first insulating layer 106*a* and the first active area 104*a*. When a current (not shown) flows through the first memory device 100, the current may flow in a direction indicated by an arrow A. In some embodiments, the current may flow along the gate structure 103 from the second active area 104*m* to the first active area 104*a*. Because the first insulating layer 106*a* is disposed within the first active area 104*a* and blocks the current, the current flows to the first portion 111*a* of the conductive layer 111 and flows through the first portion 111*a* of the conductive layer 111 to the second portion 111*b* of the conductive layer 111. In addition, because the first insulating layer 106*a* is configured to limit a P-N junction area within the first active area 104*a*, the current must pass through the conductive layer 111, and P-N junction leakage can therefore be prevented. Overall performance of the first memory device 100 is thereby improved.

In some embodiments, in order to avoid junction leakage, a length L1 of the first portion 111*a* of the conductive layer 111 is substantially equal to or less than a length L2 of the first insulating layer 106*a*. In some embodiments, the length L1 is less than the length L2. In some embodiments, the length L2 is more than twice the length L1. In some embodiments, the length L2 is 2 times to 30 times the length L1.

In some embodiments, the second portion 111*b* of the conductive layer 111 covers the doped member 105. In some embodiments, the second portion 111*b* of the conductive layer 111 is in contact with the doped member 105. In some embodiments, the second portion 111*b* is disposed over the first insulating layer 106*a* and the first active area 104*a*. In some embodiments, the second portion 111*b* of the conductive layer 111 is disposed over the first portion 111*a* of the conductive layer 111. In some embodiments, the second portion 111*b* of the conductive layer 111 is in contact with the first insulating layer 106*a*. In some embodiments, the doped member 105 is disposed between the first insulating layer 106*a* and the second portion 111*b* of the conductive layer 111.

In some embodiments, the first memory device 100 includes a second insulating layer 106*b* disposed over the gate structure 103. In some embodiments, the first insulating layer 106*a* and the second insulating layer 106*b* are separated from each other. In some embodiments, the second insulating layer 106*b* is disposed over the gate structure 103, the second active area 104*m* and the isolation structure 102 adjacent to the second active area 104*m*. In some embodiments, the second insulating layer 106*b* is in contact with the gate structure 103. In some embodiments, the second insulating layer 106*b* includes oxide. In some embodiments, the second insulating layer 106*b* includes silicon oxide or the like. In some embodiments, the first insulating layer 106*a* and the second insulating layer 106*b* include same materials. In some embodiments, a thickness T1 of the first insulating layer 106*a* is less than or equal to a thickness T2 of the second insulating layer 106*b*. In some embodiments, the first insulating layer 106*a* and the second insulating layer 106*b* are formed simultaneously or separately.

In some embodiments, the first portion 111*a* of the conductive layer 111 is disposed between and coupled to the first insulating layer 106*a* and the second insulating layer 106*b*. In some embodiments, the second portion 111*b* of the conductive layer 111 is disposed between the first insulating layer 106*a* and the second insulating layer 106*b*. In some embodiments, a top surface of the second portion 111*b* of the conductive layer 111 is substantially coplanar with a top surface 106*c* of the second insulating layer 106*b*. In some embodiments, a top surface 105*a* of the doped member 105 is substantially coplanar with the top surface 106*c* of the second insulating layer 106*b*. In some embodiments, the top surface 106*c* of the second insulating layer 106*b* is substantially lower than the second portion 111*b* of the conductive layer 111.

Figure 2:
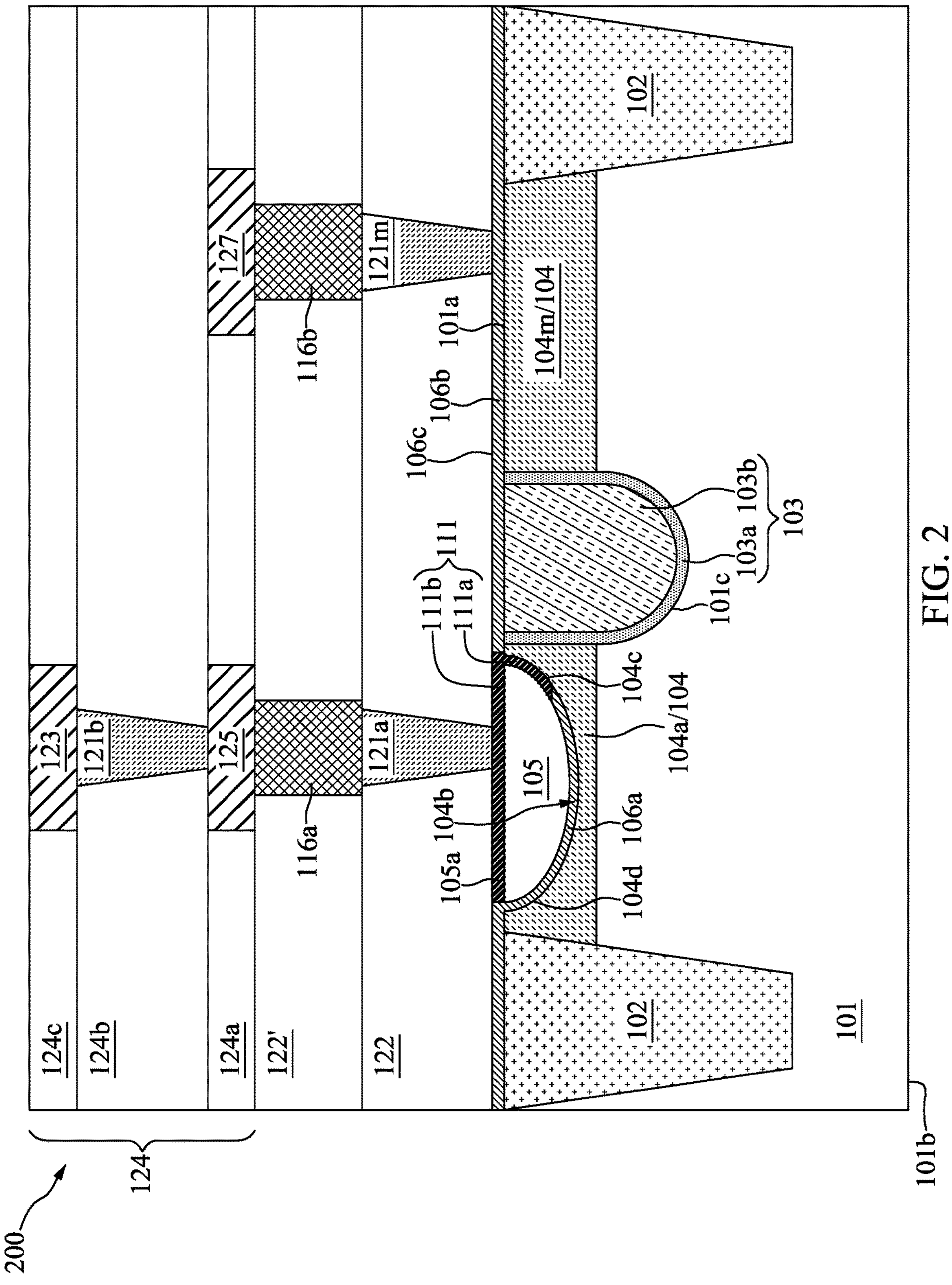
FIG. 2 is a cross-sectional side view of a memory device in accordance with other embodiments of the present disclosure.

FIG. 2 is a schematic cross-sectional side view of a second memory device 200 in accordance with some embodiments of the present disclosure. In some embodiments, the second memory device 200 illustrated in FIG. 2 is similar to the first memory device 100 illustrated in FIG. 1, except the second memory device 200 further includes a contact 121*a* disposed over the conductive layer 111, a conductive pillar 116*a* disposed over the contact 121*a*, and a capacitor 123 electrically connected to the conductive layer 111 through the contact 121*a* and the conductive pillar 116*a*. In some embodiments, a landing pad 125 is disposed over the conductive pillar 116*a*, and a contact 121*b* is disposed over the landing pad 125, such that the conductive pillar 116*a*, the landing pad 125 and the contact 121*b* are disposed between the contact 121*a* and the capacitor 123. In some embodiments, the capacitor 123 is electrically connected to the first active region 104*a* in the semiconductor substrate 101 by the contacts 121*a*, 121*b*, the conductive pillar 116*a*, the landing pad 125, and the conductive layer 111. In some embodiments, the capacitor 123 is disposed over the contacts 121*a*, 121*b*, the conductive pillar 116*a*, and the landing pad 125. In some embodiments, the conductive pillar 116*a* is disposed over the contact 121*a* and disposed between the contact 121*a* and the landing pad 125. In some embodiments, the second memory device 200 is a DRAM.

In some embodiments, the second memory device 200 further includes a contact 121*m* disposed over the second active region 104*m*, a conductive pillar 116*b* disposed over the contact 121*m*, and a bit line 127 electrically connected to the second active region 104*m* in the semiconductor substrate 101 through the contact 121*m* and the conductive pillar 116*b*. In some embodiments, the contact 121*m* penetrates through the second insulating layer 106*b*. In some embodiments, the contact 121*m* is surrounded by the second insulating layer 106*b* and electrically connected to the second active region 104*m*. In some embodiments, the bit line 127 is disposed adjacent to the landing pad 125. In some embodiments, the conductive pillar 116*b* is disposed over the contact 121*m* and disposed between the contact 121*m* and the bit line 127.

In some embodiments, the contacts 121*a*, 121*b*, 121*m* include conductive material, such as polycrystalline silicon, tungsten (W), copper (Cu), or the like. In some embodiments, the capacitor 123, the landing pad 125 and the bit line 127 include conductive material, such as polycrystalline silicon, tungsten (W), copper (Cu), or the like. In some embodiments, the conductive pillars 116*a*, 116*b* include conductive material, such as polycrystalline silicon, tungsten (W), copper (Cu), or the like. The contacts 121*a*, 121*b*, 121*m*, the capacitor 123, the landing pad 125, the conductive pillars 116*a*, 116*b*, and the bit line 127 include a same material or different materials. In some embodiments, the landing pad 125, the bit line 127 and the conductive pillars 116*a*, 116*b* are respectively made of different conductive materials. In some embodiments, a resistivity of the conductive material for forming the landing pad 125 and the bit line 127 is less than a resistivity of the conductive material for forming the conductive pillars 116*a*, 116*b*, and the conductive material for forming the conductive pillars 116*a*, 116*b* has an etching selectivity with respect to the conductive material that is sufficient for forming the landing pad 125 and the bit line 127. In some embodiments, each of the conductive pillars 116*a*, 116*b* is a single-layer structure. In some embodiments, each of the conductive pillars 116*a*, 116*b* is a multi-layer structure including same or different conductive materials. In some embodiments, each of the conductive pillars 116*a*, 116*b* has a thickness greater than a thickness of the landing pad 125.

In some embodiments, the second memory device 200 further includes a first dielectric layer 122 surrounding the contacts 121*a*, 121*m* and covering the conductive layer 111, the first insulating layer 106*a*, the second insulating layer 106*b*, the doped member 105, the active area 104 and the gate structure 103. In some embodiments, the contacts 121*a*, 121*m* penetrate through the first dielectric layer 122. In some embodiments, the first dielectric layer 122 includes silicon oxide, silicon nitride, silicon oxynitride, phosphosilicate glass (PSG), borophosphosilicate glass (BPSG), low-k dielectric material, and/or another applicable dielectric material.

In some embodiments, the second memory device 200 includes a second dielectric layer 122' over the first dielectric layer 122 and surrounding the conductive pillars 116*a*, 116*b*. In some embodiments, the conductive pillars 116*a*, 116*b* penetrate through the second dielectric layer 122'. In some embodiments, the second dielectric layer 122' includes silicon oxide, silicon nitride, silicon oxynitride, phosphosilicate glass (PSG), borophosphosilicate glass (BPSG), low-k dielectric material, and/or another applicable dielectric material.

In some embodiments, the second memory device 200 includes a third dielectric layer 124 over the second dielectric layer 122' and surrounding the capacitor 123. In some embodiments, the third dielectric layer 124 includes a plurality of sub-layers 124*a*, 124*b* and 124*c*. In some embodiments, the sub-layer 124*a* is disposed over the second dielectric layer 122', and the landing pad 125 is surrounded by the sub-layer 124*a*. In some embodiments, the sub-layer 124*b* is disposed over the sub-layer 124*a*, and the contact 121*b* is surrounded by the sub-layer 124*b*. In some embodiments, the sub-layer 124*c* is disposed over the sub-layer 124*b*, and the capacitor 123 is surrounded by the sub-layer 124*c*. In some embodiments, the bit line 127 is surrounded by the third dielectric layer 124. In some embodiments, the bit line 127 is surrounded by the sub-layer 124*a*.

In some embodiments, a plurality of capacitors 123 are disposed within the third dielectric layer 124. In some embodiments, the capacitors 123 are electrically connected to corresponding active regions 104 in the semiconductor substrate 101 by a plurality of landing pads 125, a plurality of conductive pillars 116*a*, and a plurality of contacts 121*a*, 121*b*. In some embodiments, the capacitors 123 are disposed within the third dielectric layer 124. In some embodiments, the third dielectric layer 124 includes silicon oxide, silicon nitride, silicon oxynitride, phosphosilicate glass (PSG), borophosphosilicate glass (BPSG), low-k dielectric material, and/or another applicable dielectric material. The first dielectric layer 122, the second dielectric layer 122' and the third dielectric layer 124 include a same material or different materials. In some embodiments, the second dielectric layer 122' and the third dielectric layer 124 are inter-layer dielectrics (ILD).

Figure 3:
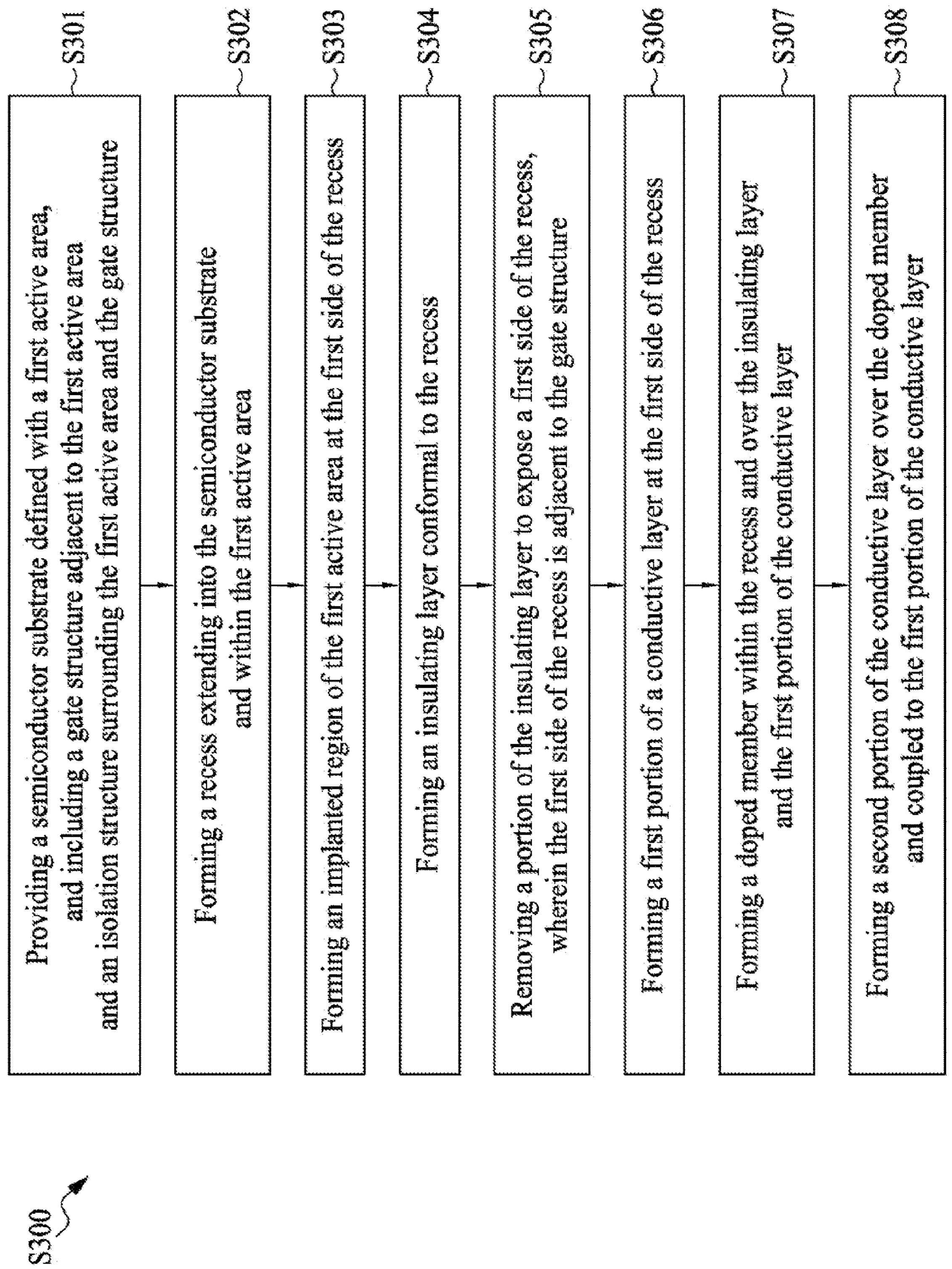
FIG. 3 is a flow diagram illustrating a method of manufacturing a memory device in accordance with some embodiments of the present disclosure.

FIG. 3 is a flow diagram illustrating a method S300 of manufacturing the first memory device 100 or the second memory device 200 in accordance with some embodiments of the present disclosure, and FIGS. 4 to 23 are cross-sectional views of intermediate stages in formation of the first memory device 100 or the second memory device 200 in accordance with some embodiments of the present disclosure.

The stages shown in FIGS. 4 to 23 are also illustrated schematically in the flow diagram in FIG. 3. In following discussion, the fabrication stages shown in FIGS. 4 to 23 are discussed in reference to process steps shown in FIG. 3. The method S300 includes a number of operations, and description and illustration are not deemed as a limitation to a sequence of the operations. The method S300 includes a number of steps (S301, S302, S303, S304, S305, S306, S307 and S308).

Figure 4:
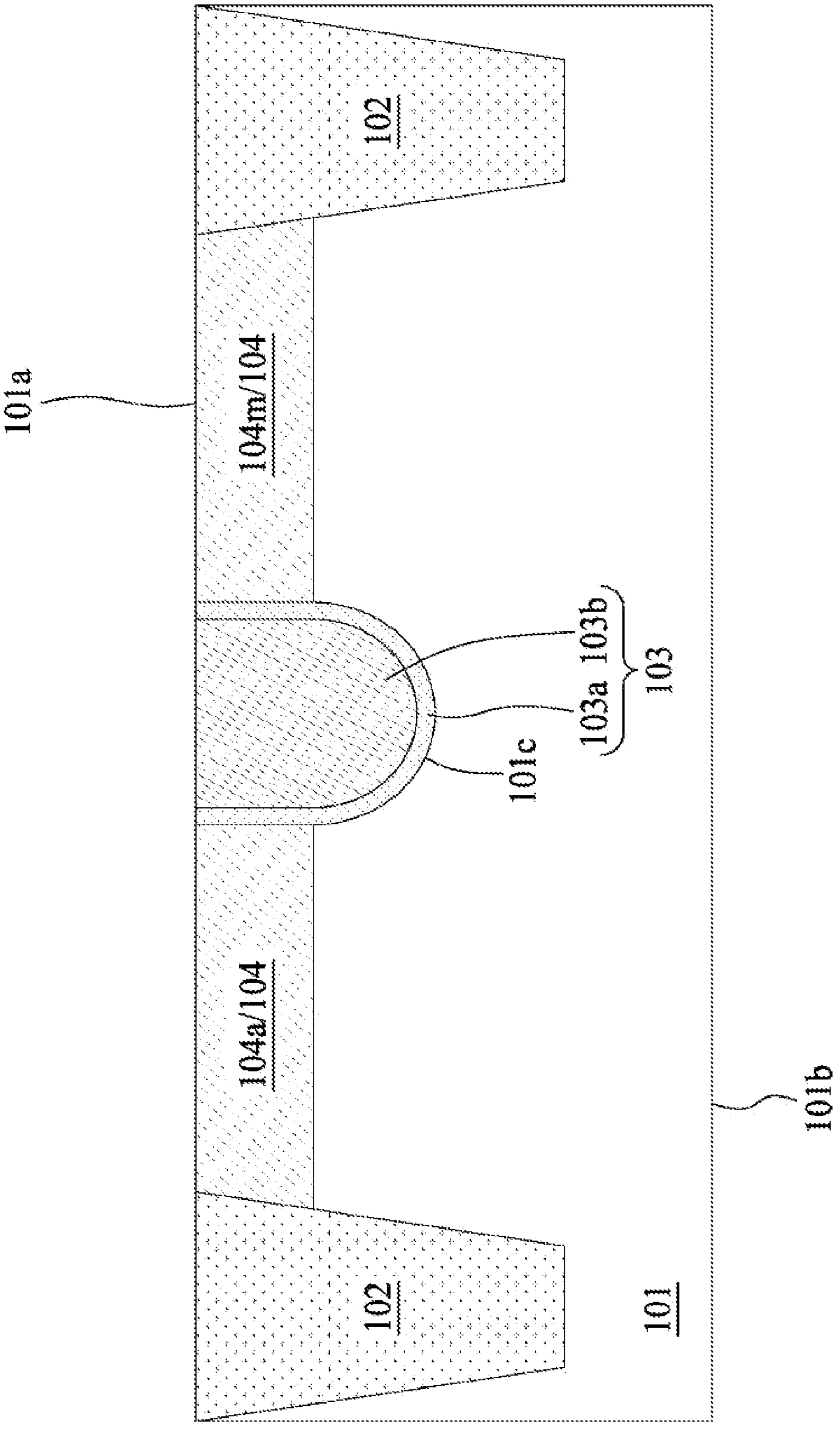
FIGS. 4 to 23 are cross-sectional views of intermediate stages in the formation of a memory device in accordance with some embodiments of the present disclosure.

Referring to FIG. 4, a semiconductor substrate 101 is provided in accordance with step S301 in FIG. 3. The semiconductor substrate 101 is defined with a first active area 104*a* and includes a gate structure 103 adjacent to the first active area 104*a* and an isolation structure 102 surrounding the first active area 104*a* and the gate structure 103. In some embodiments, the gate structure 103 is disposed adjacent to the first active area 104*a* and extends from a first surface 101*a* toward a second surface 101*b* of the semiconductor substrate 101. In some embodiments, the isolation structure 102 extends from the first surface 101*a* toward the second surface 101*b* of the semiconductor substrate 101. In some embodiments, the gate structure 103 is disposed between the first active area 104*a* and a second active area 104*m*. In some embodiments, the first active area 104*a* includes N-type dopants. In some embodiments, the semiconductor substrate 101 is a p-type substrate.

Figure 5:
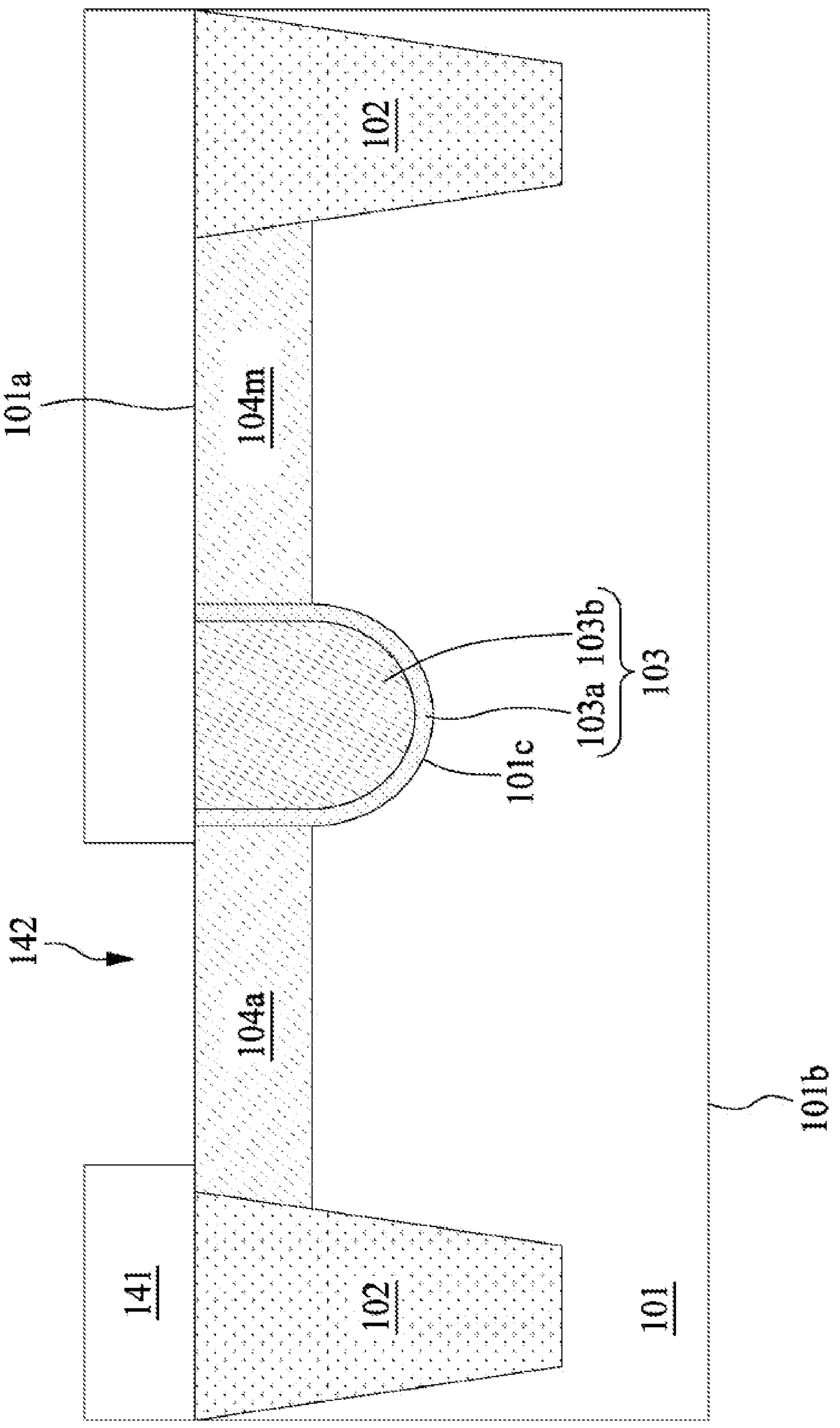
Figure 6:
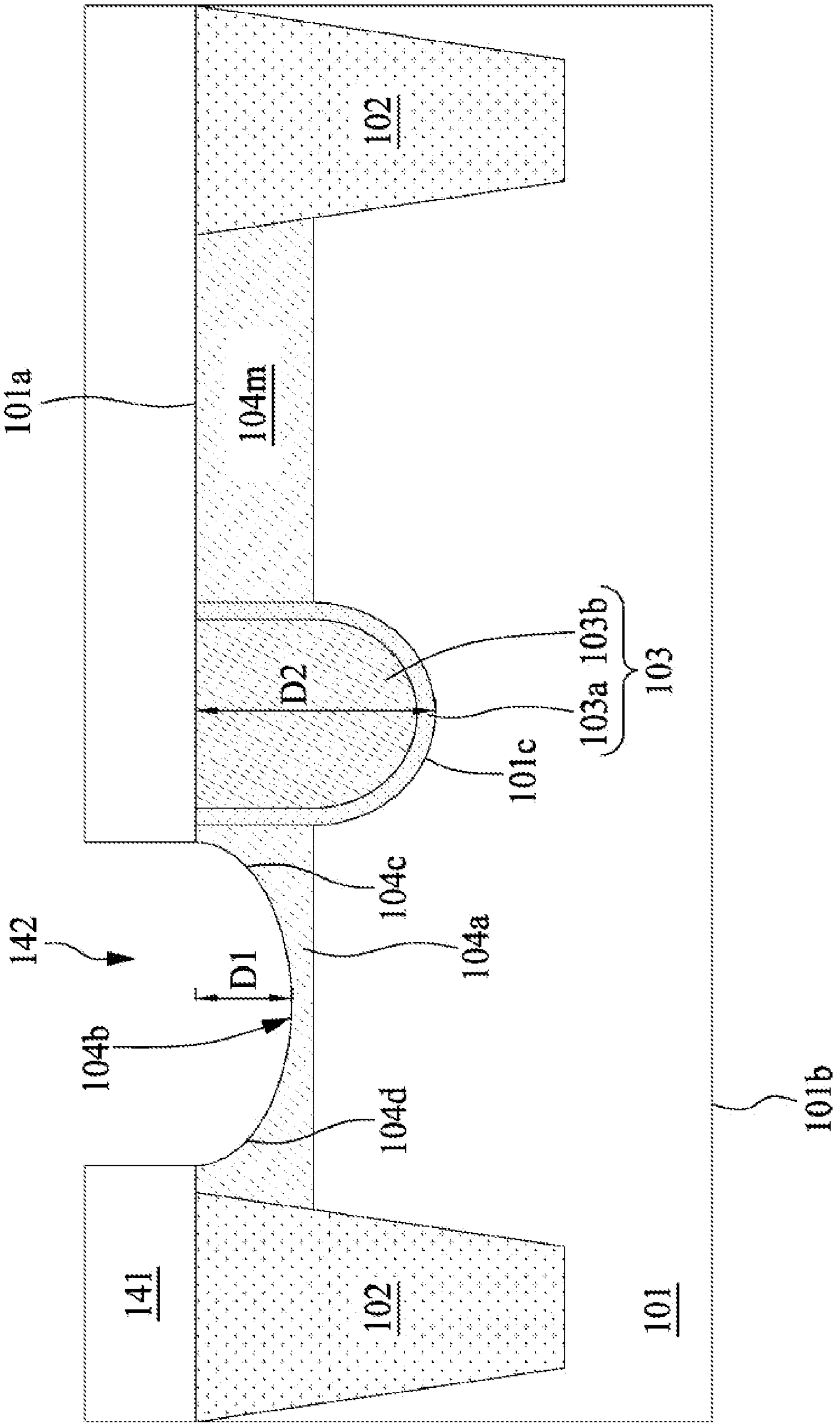
Figure 7:
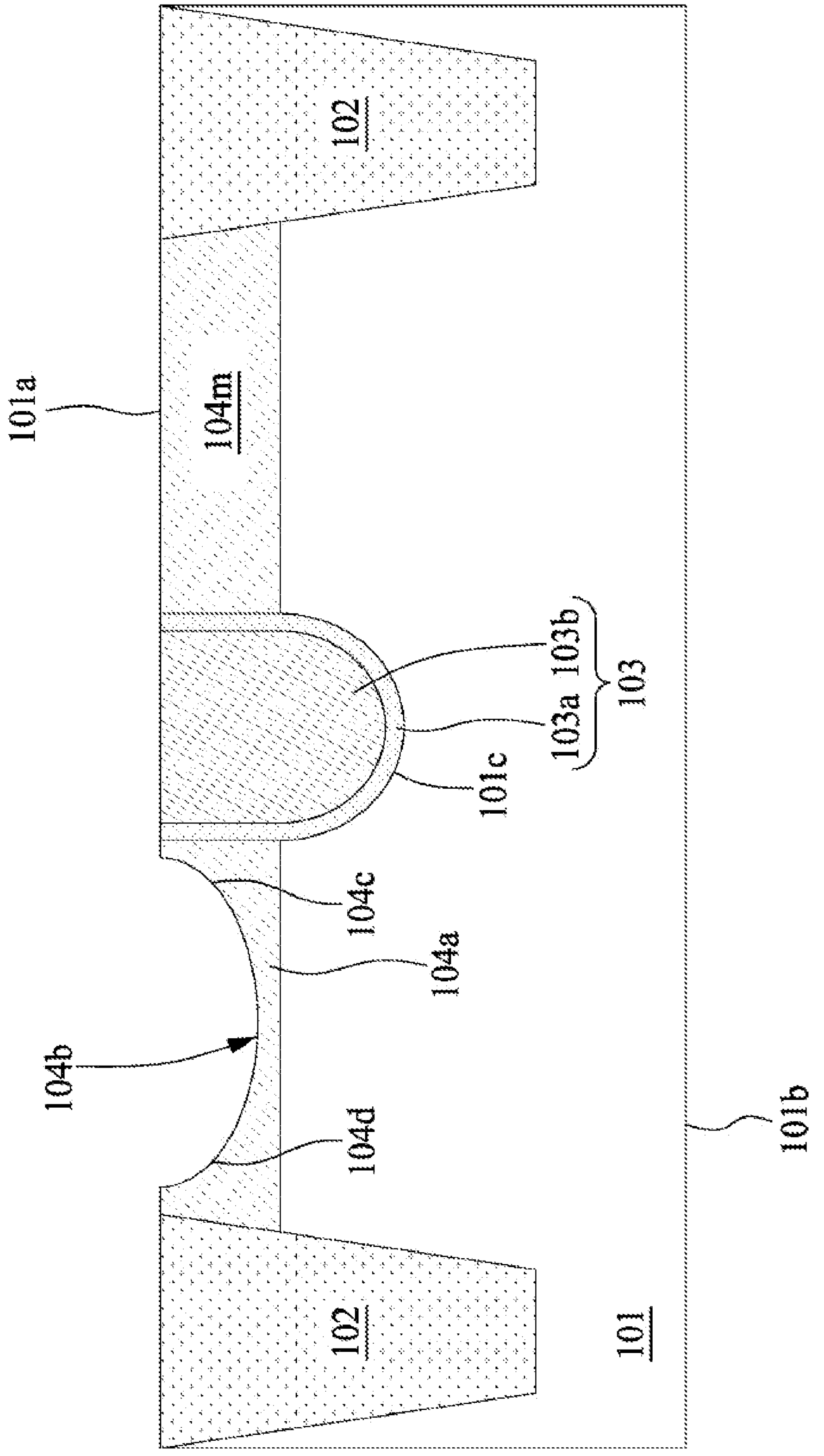

Referring to FIGS. 5 to 7, a recess 104*b* is formed extending into the semiconductor substrate 101 and within the first active area 104*a* in accordance with step S302 in FIG. 3. In some embodiments, referring to FIG. 5, a pattern mask 141 is disposed over the first surface 101*a* of the semiconductor substrate 101. In some embodiments, the pattern mask 141 includes an opening 142 provided over the first active area 104*a*. The opening 142 exposes the first active area 104*a* proximal to the gate structure 103. The pattern mask 141 is formed by steps including (1) conformally coating a photosensitive material on the first surface 101*a* of the semiconductor substrate 101, (2) exposing portions of the photosensitive material to radiation (not shown), (3) performing a post-exposure baking process, and (4) developing the photosensitive material, thereby forming the opening 142 to expose the first active area 104*a* proximal to the gate structure 103.

Referring to FIG. 6, the recess 104*b* extending into the semiconductor substrate 101 is formed. In some embodiments, the recess 104*b* extends within the first active area 104*a*. In some embodiments, the formation of the recess 104*b* includes removing some portions of the semiconductor substrate 101. In some embodiments, the recess 104*b* extends from the first surface 101*a* toward the second surface 101*b* of the semiconductor substrate 101. In some embodiments, a depth D1 of the recess 104*b* is less than a depth D2 of the gate structure 103. In some embodiments, the recess 104*b* has a first side 104*c* adjacent to the gate structure 103 and a second side 104*d* opposite to the first side 104*c* and adjacent to the isolation structure 102. In some embodiments, the recess 104*b* is formed by etching or any other suitable process. In some embodiments, the recess 104*b* is formed by dry etching. Referring to FIG. 7, in some embodiments, the pattern mask 141 is removed after the recess 104*b* is formed.

Figure 8:
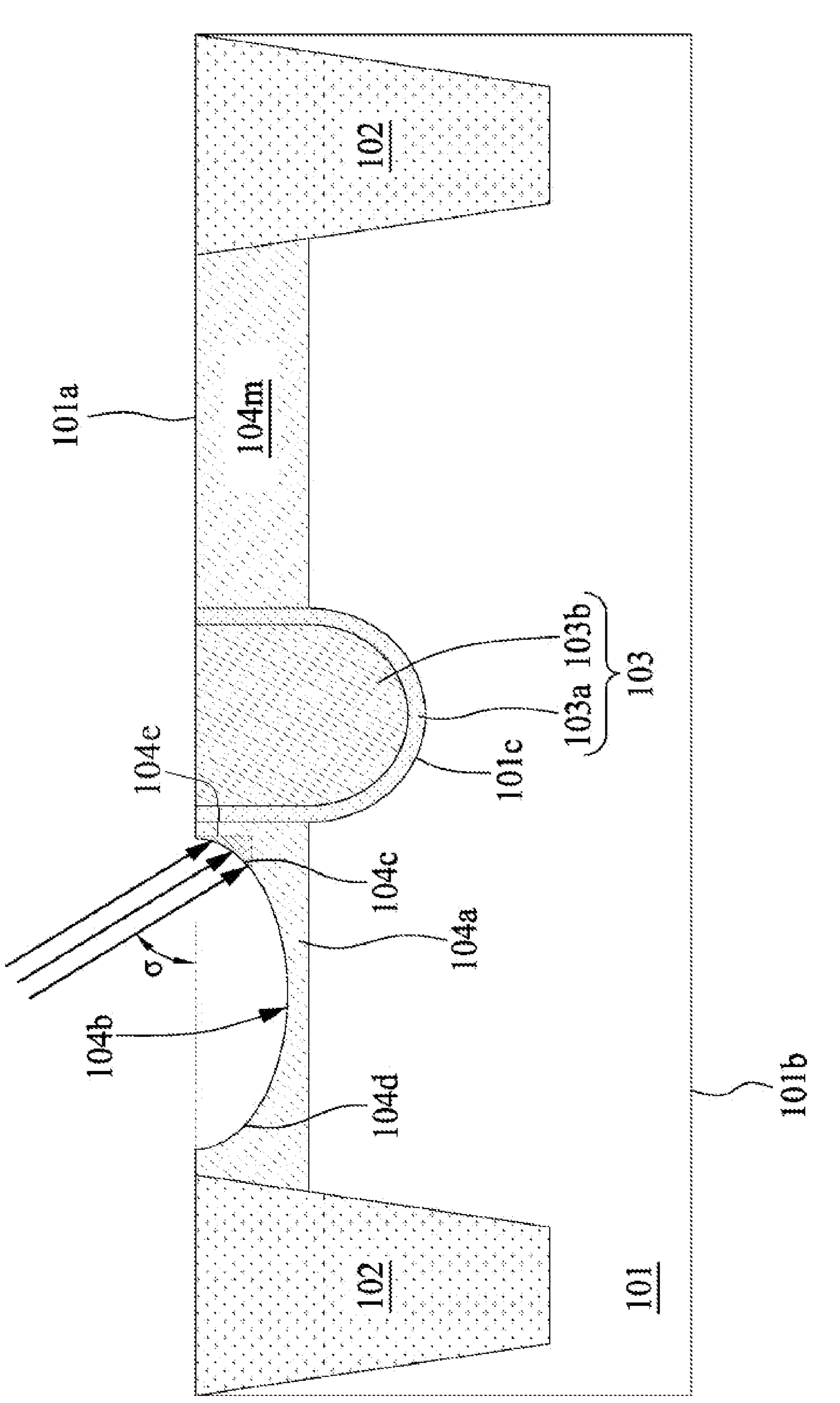

Referring to FIG. 8, an implanted region 104*e* of the first active area 104*a* is formed on the first side 104*c* of the recess 104*b* in accordance with step S303 in FIG. 3. In some embodiments, the implanted region 104*e* is formed by implanting implants in the recess 104*b* and toward the gate structure 103. In some embodiments, the implanted region 104*e* is formed by implanting implants at an angle $\sigma$ into the first active area 104*a* of the semiconductor substrate 101. In some embodiments, the angle $\sigma$ relative to the first surface 101*a* of the semiconductor substrate 101 is between 7 degrees and 30 degrees. In some embodiments, the implanted region 104*e* is formed by nitrogen ion implantation. In some embodiments, step S303 is omitted.

Figure 9:
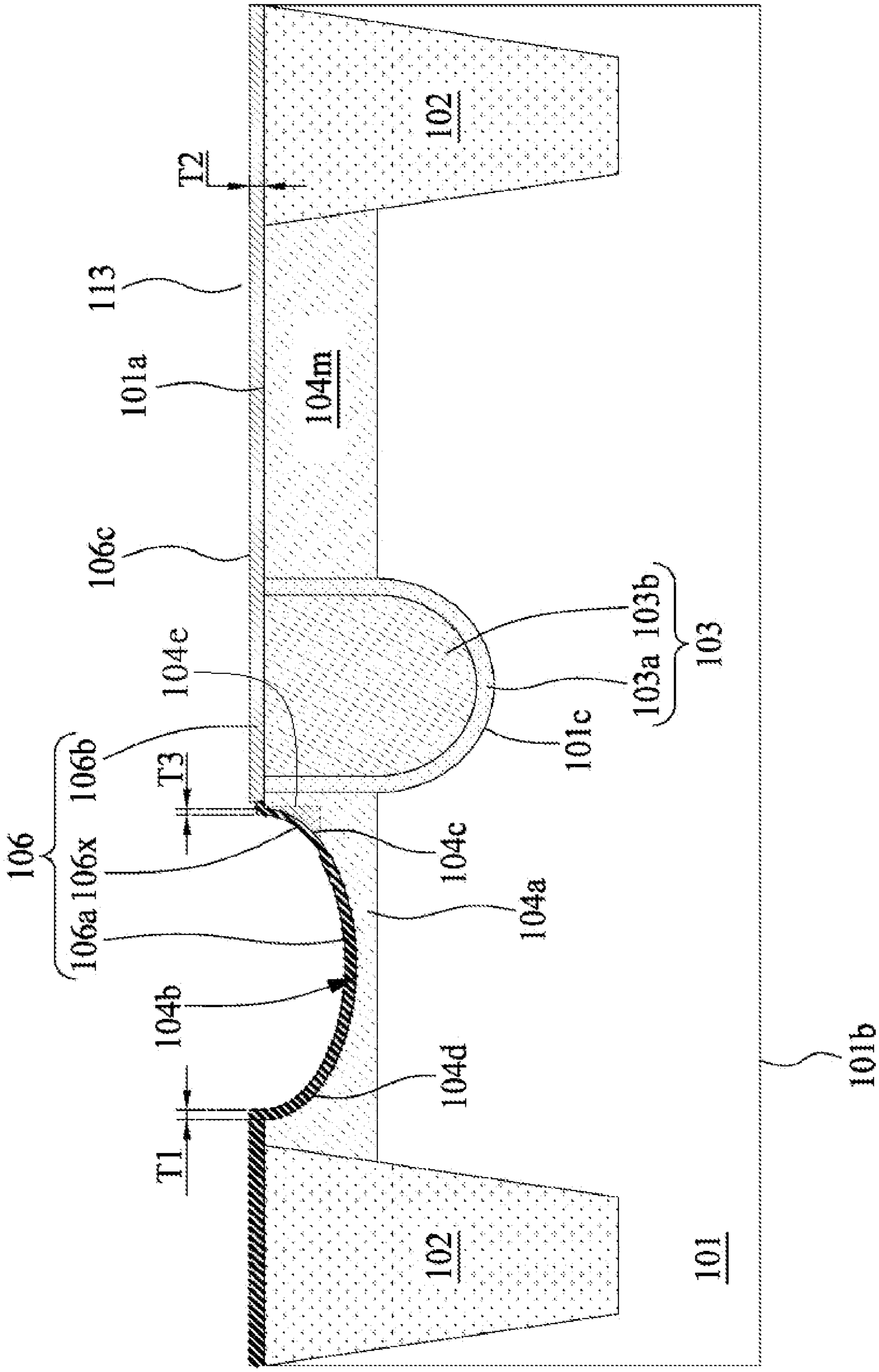

Referring to FIG. 9, an insulating layer 106 is formed conformal to the recess 104*b* in accordance with step S304 in FIG. 3. In some embodiments, the insulating layer 106 is formed over the isolation structure 102, the recess 104*b*, the gate structure 103, and the second active area 104*m*. In some embodiments, the insulating layer 106 is formed over the first surface 101*a* of the semiconductor substrate 101. In some embodiments, the insulating layer 106 is formed by deposition, oxidation, a spin-coating process, or any other suitable process. In some embodiments, the insulating layer 106 is formed by a chemical vapor deposition (CVD) process, a physical vapor deposition (PVD) process, an atomic layer deposition (ALD) process, or any other suitable process. In some embodiments, the insulating layer 106 includes oxide such as silicon oxide.

In some embodiments, the insulating layer 106 is not easily formed on the first side 104*c* of the recess 104*b*. In some embodiments, the insulating layer 106 is not easily formed on the implanted region 104*e*. In some embodiments, a thickness T3 of a portion 106*x* of the insulating layer 106 over the implanted region 104*e* is less than a thickness T1 of a portion 106*a* of the insulating layer 106 over the second side 104*d* of the recess 104*b*.

Figure 10:
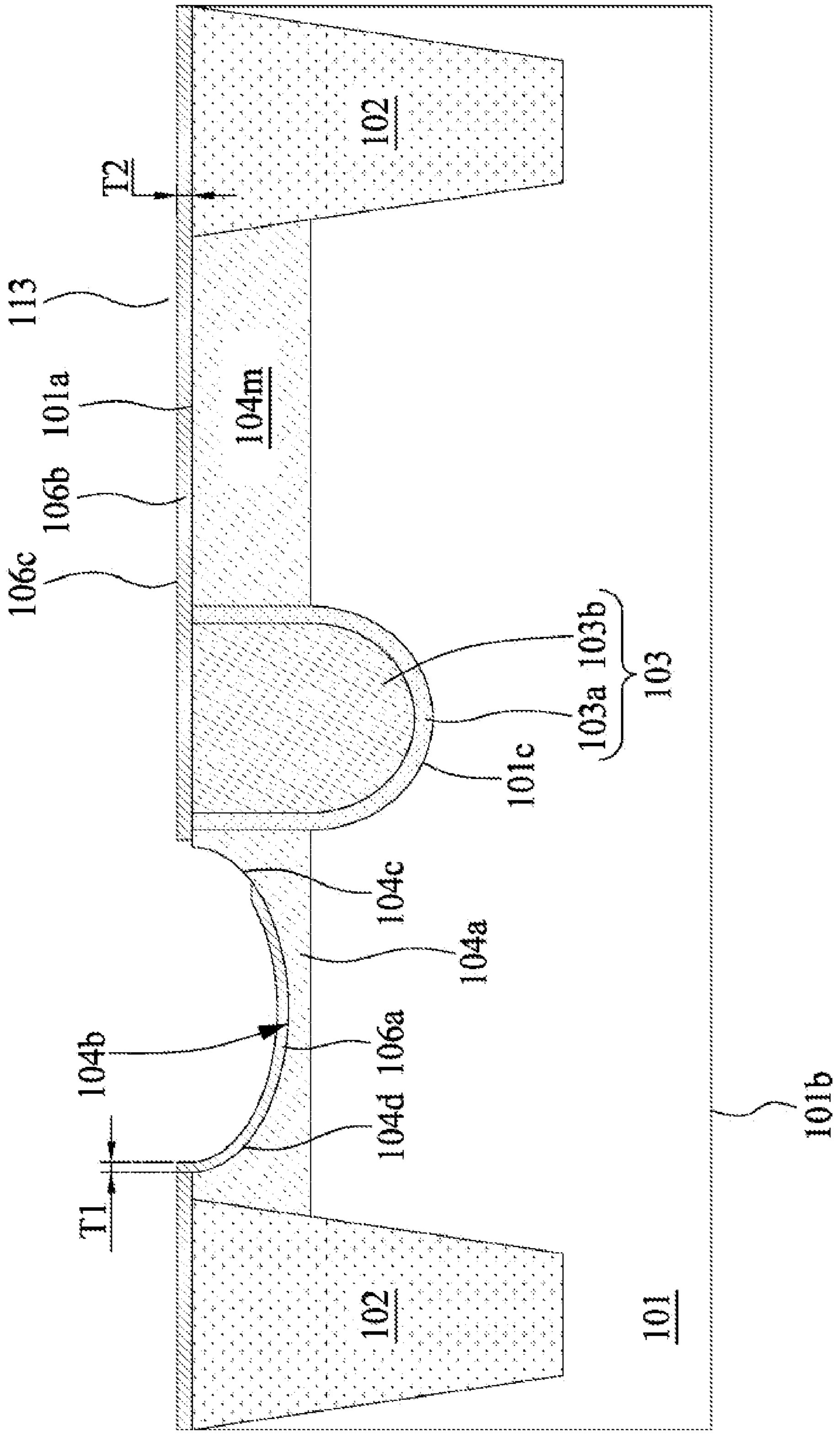

Referring to FIG. 10, in accordance with step S305 in FIG. 3, the portion 106*x* of the insulating layer 106 is removed to expose the first side 104*c* of the recess 104*b*, wherein the first side 104*c* of the recess 104*b* is adjacent to the gate structure 103. In some embodiments, the portion 106*x* of the insulating layer 106 is disposed over the implanted region 104*e*. In some embodiments, the portion 106*x* of the insulating layer 106 is removed by etching or any other suitable process. In some embodiments, the portion 106*x* of the insulating layer 106 is washed away by a dilute hydrofluoric acid solution (DHF). In some embodiments, the implants of the implanted region 104*e* are removed after the first side 104*c* of the recess 104*b* is exposed.

In some embodiments, after the removal of the portion 106*x* of the insulating layer 106, the insulating layer 106 is separated into a first segment 106*a* disposed within the recess 104*b* and a second segment 106*b* disposed over the gate structure 103. In some embodiments, the thickness T1 of the first segment 106*a* of the insulating layer 106 is less than a thickness T2 of the second segment 106*b* of the insulating layer 106 after the removal of the portion 106*x* of the insulating layer 106. In some embodiments, the first segment 106*a* of the insulating layer 106 forms a first insulating layer 106*a*, and the second segment 106*b* of the insulating layer 106 forms a second insulating layer 106*b*.

Figure 11:
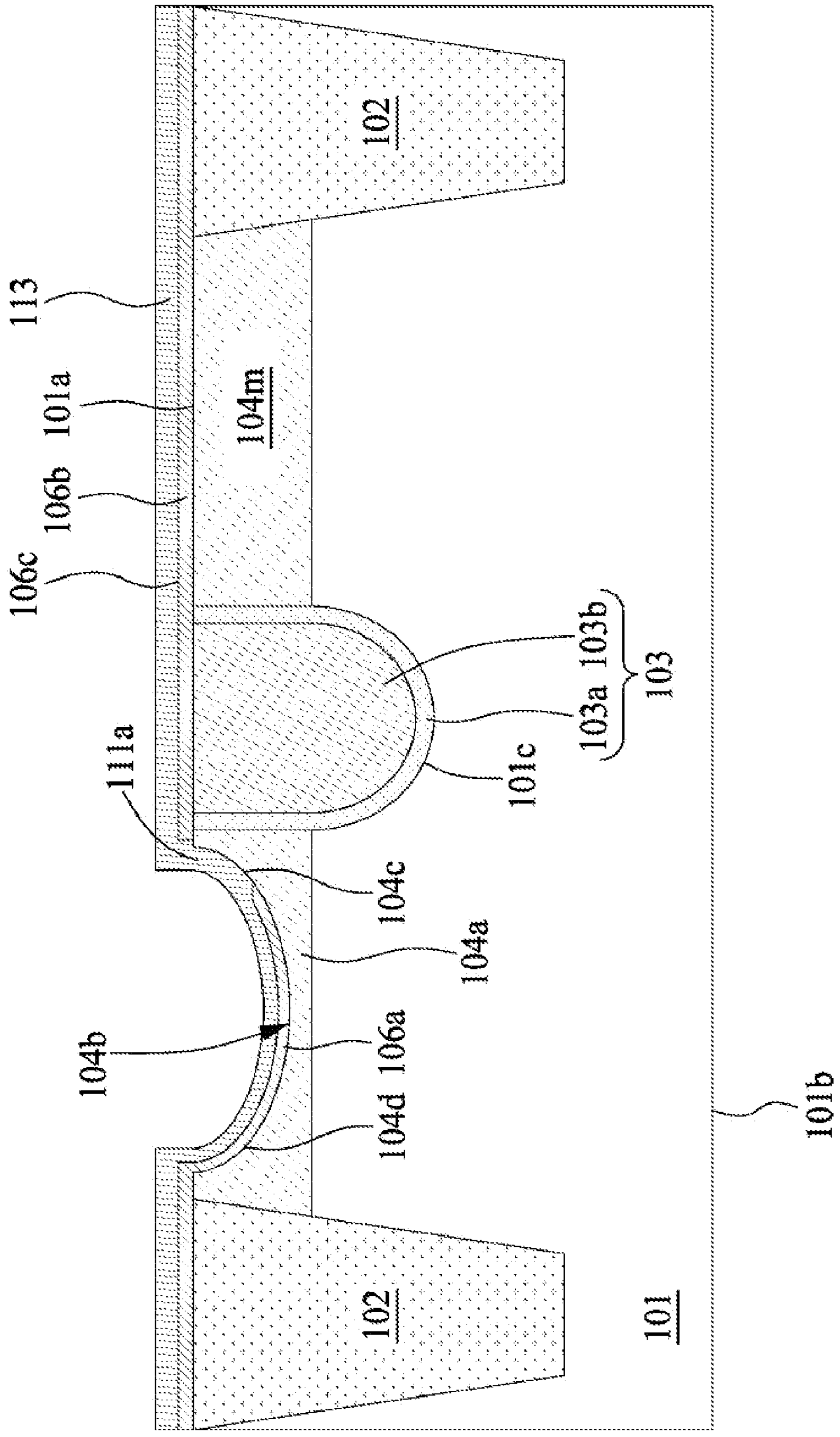
Figure 12:
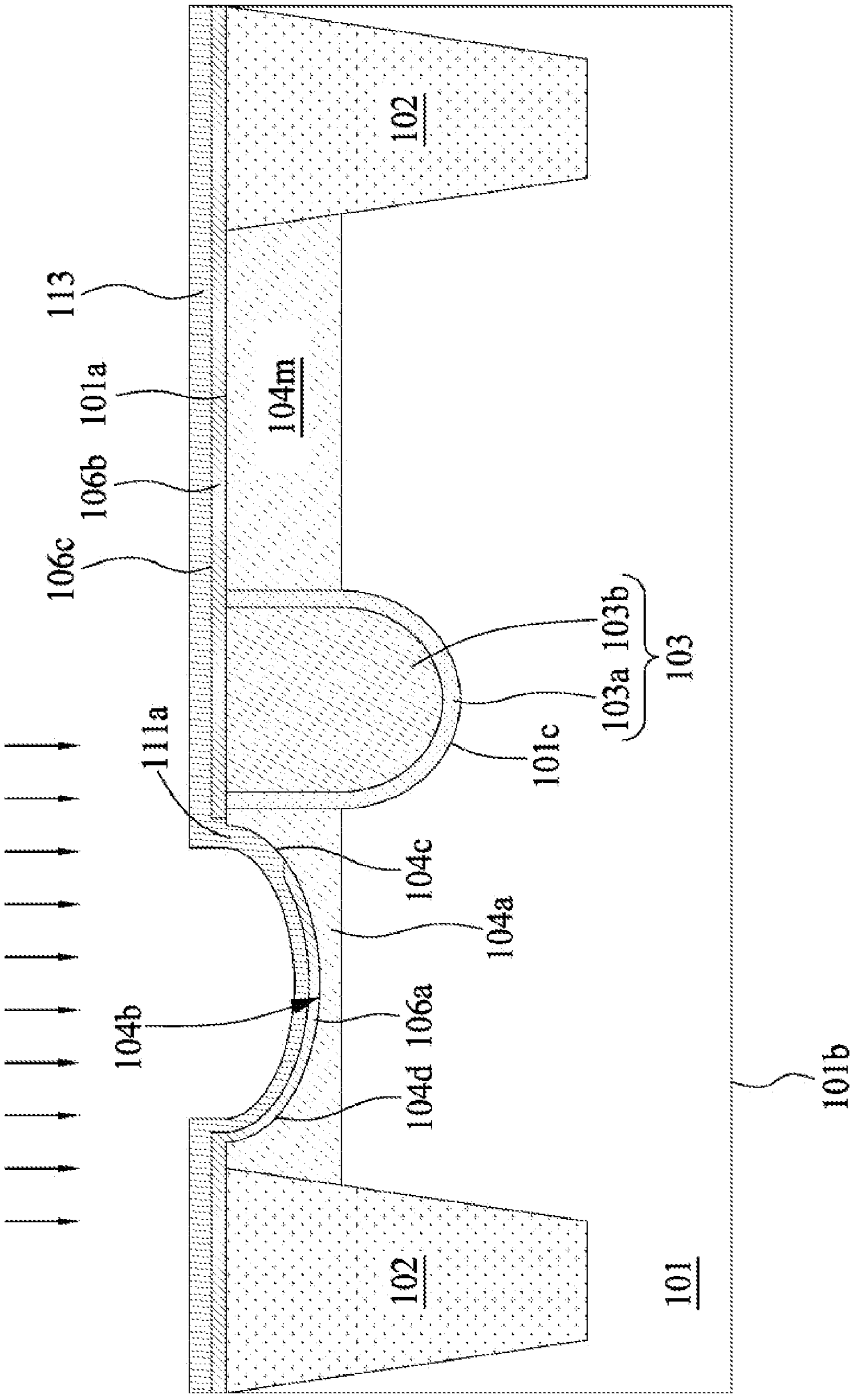
Figure 13:
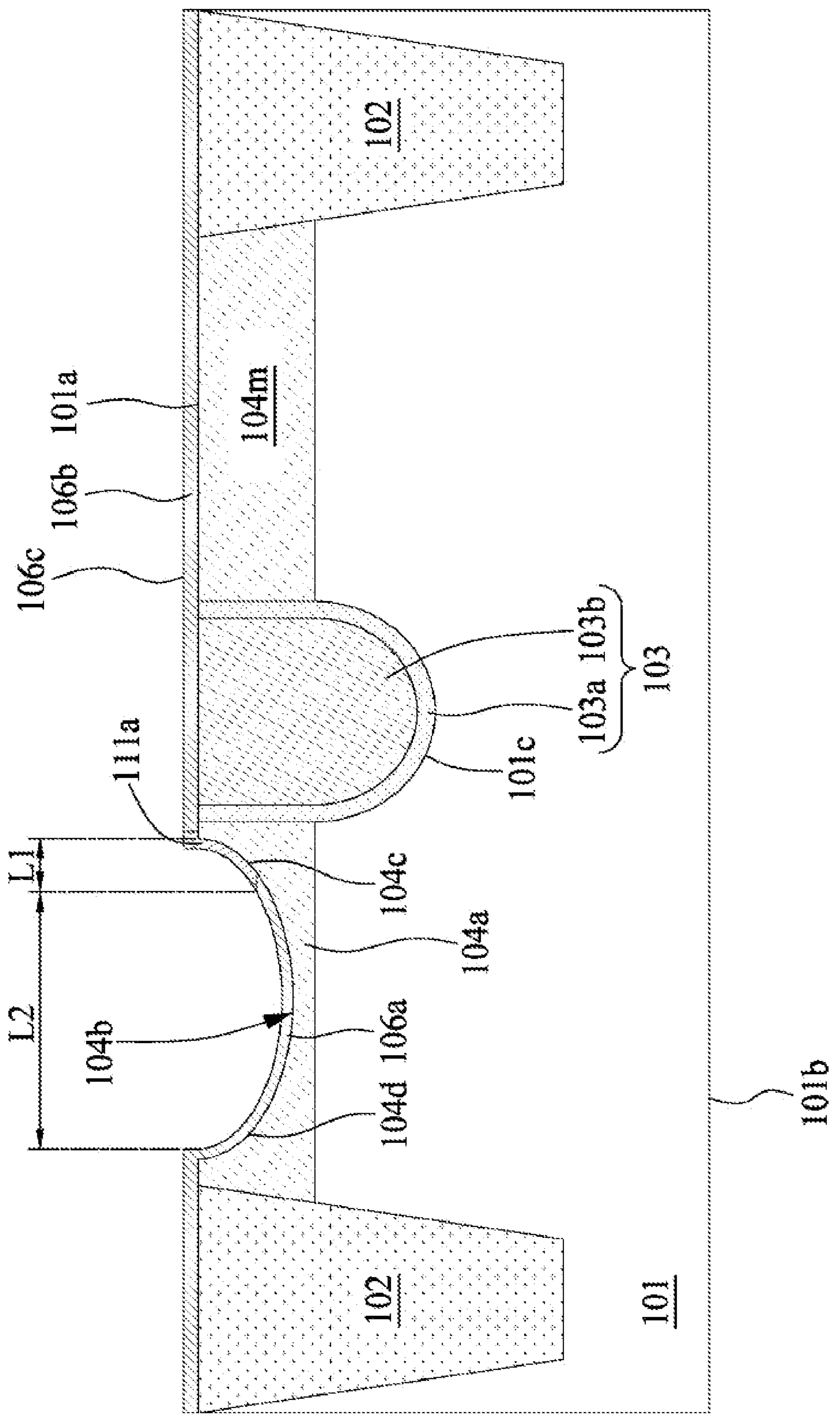

Referring to FIGS. 11 to 13, a first portion 111*a* of a conductive layer 111 is formed on the first side 104*c* of the recess 104*b* in accordance with step S306 in FIG. 3. In some embodiments, referring to FIG. 11, a first conductive material 113 is disposed over the first side 104*c* of the recess 104*b*, the first insulating layer 106*a* and the second insulating layer 106*b*. In some embodiments, the first conductive material 113 is conformal to the first side 104*c* of the recess 104*b*. In some embodiments, the first conductive material 113 includes the first portion 111*a* of the conductive layer 111. In some embodiments, the first conductive material 113 is formed by a chemical vapor deposition (CVD) process, a physical vapor deposition (PVD) process, an atomic layer deposition (ALD) process or any other suitable process. In some embodiments, the first conductive material 113 includes cobalt.

In some embodiments, referring to FIG. 12, the first portion 111*a* of the conductive layer 111 is annealed. In some embodiments, the first conductive material 113 is annealed. In some embodiments, the first portion 111*a* of the conductive layer 111 is annealed at a temperature between 650° C. and 800° C.

In some embodiments, referring to FIG. 13, the first conductive material 113 disposed on the first insulating layer 106*a* and the second insulating layer 106*b* is removed, and the first portion 111*a* of the conductive layer 111 is formed on the first side 104*c* of the recess 104*b*. In some embodiments, the formation of the first portion 111*a* of the conductive layer 111 is performed after the formation of the insulating layer 106 and the removal of the portion 106*x* of the insulating layer 106.

In some embodiments, the first conductive material 113 disposed on the first insulating layer 106*a* and the second insulating layer 106*b* is removed by etching or any other suitable process. In some embodiments, the first conductive material 113 disposed on the first insulating layer 106*a* and the second insulating layer 106*b* is washed away by a dilute hydrofluoric acid solution (DHF). In some embodiments, a length L1 of the first portion 111*a* of the conductive layer 111 is substantially equal to or less than a length L2 of the first insulating layer 106*a*. In some embodiments, the length L1 is less than the length L2.

Figure 14:
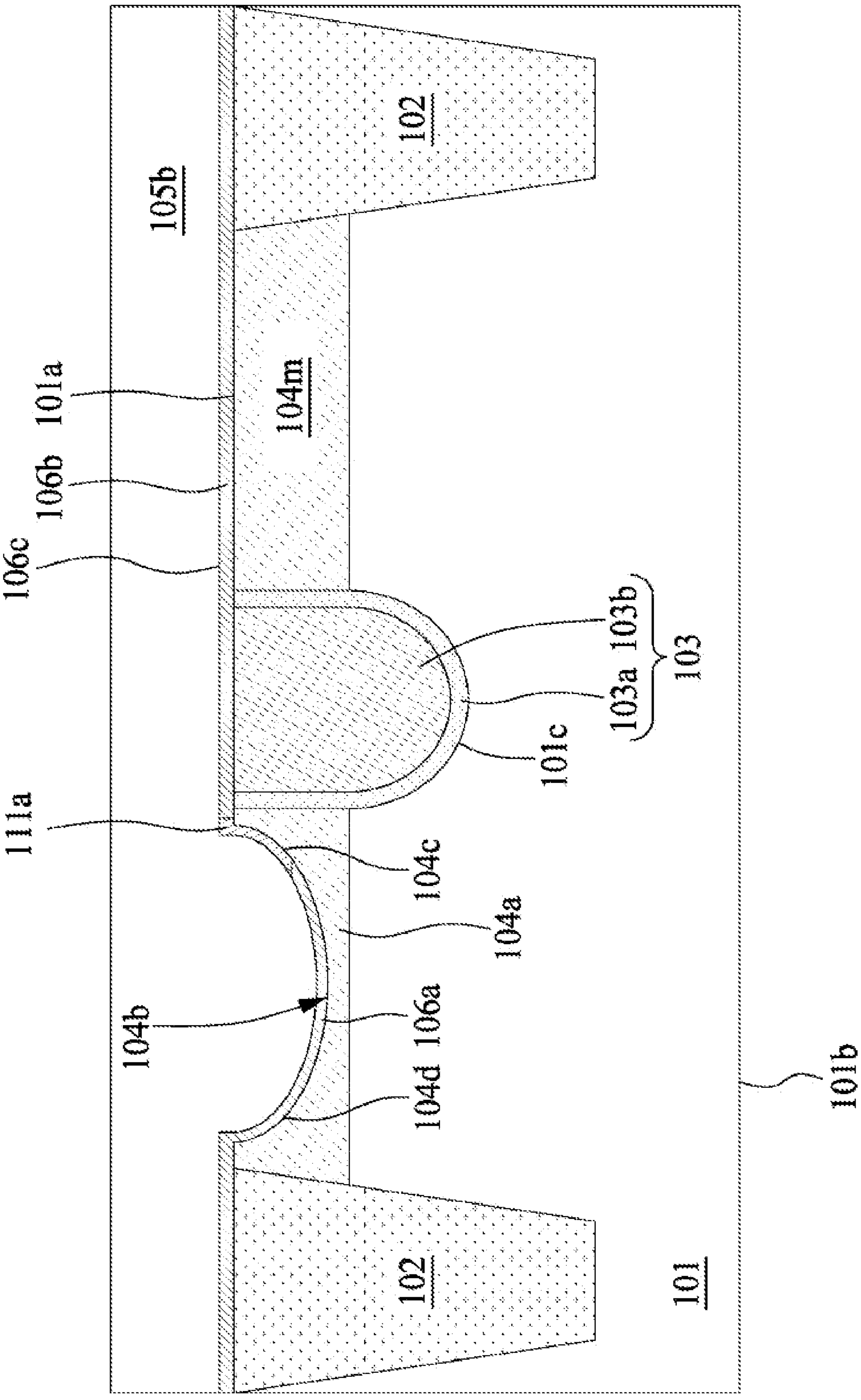
Figure 15:
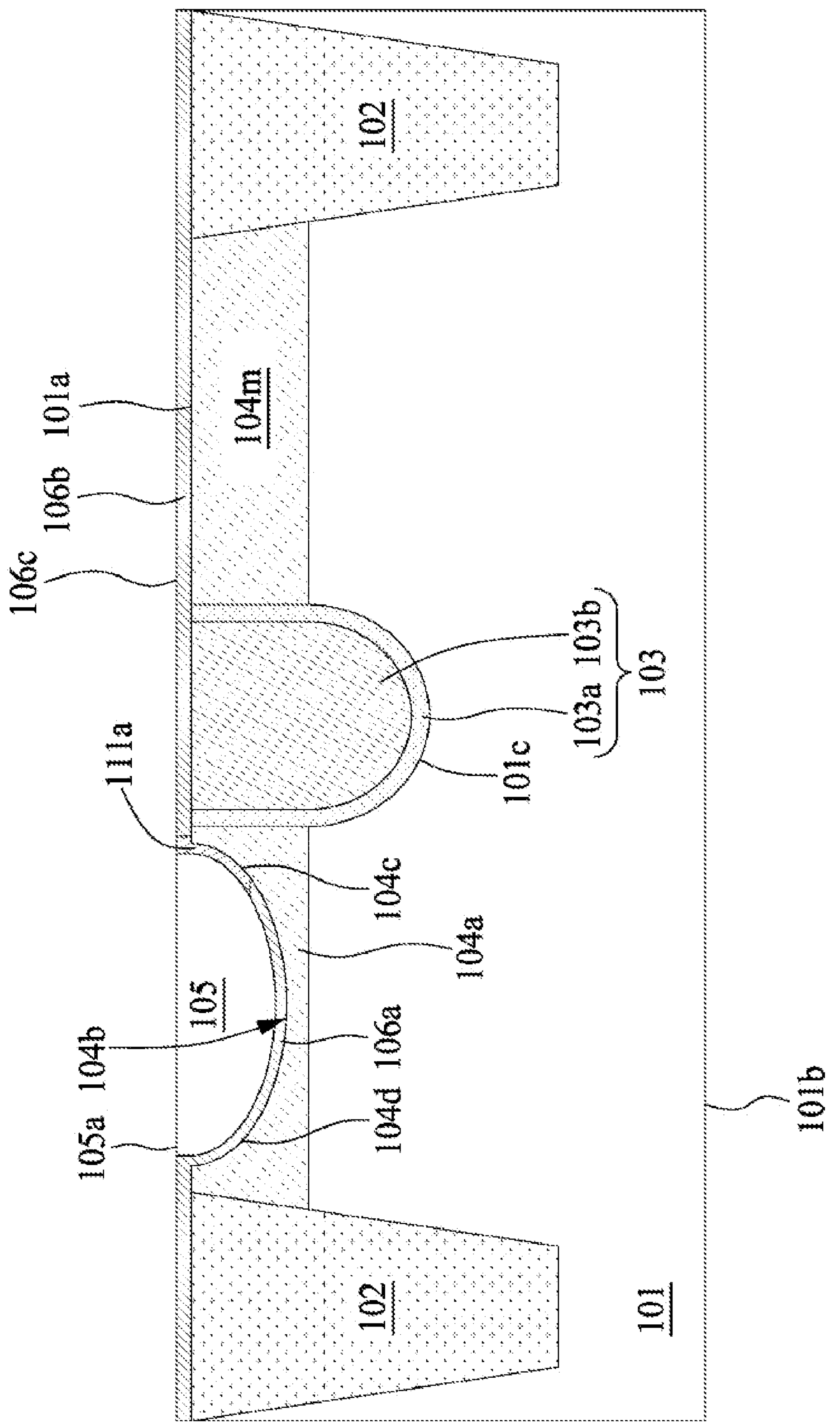

Referring to FIGS. 14 and 15, a doped member 105 is formed within the recess 104*b* and over the insulating layer 106 and the first portion 111*a* of the conductive layer 111 in accordance with step S307 in FIG. 3. In some embodiments, referring to FIG. 14, a doped material 105*b* is disposed within the recess 104*b* and over the first portion 111*a* of the conductive layer 111, the first insulating layer 106*a* and the second insulating layer 106*b*. In some embodiments, the doped material 105*b* includes polycrystalline silicon. In some embodiments, the doped material 105*b* is formed by a chemical vapor deposition (CVD) process, a physical vapor deposition (PVD) process, an atomic layer deposition (ALD) process, a spin-coating process, or another applicable process.

In some embodiments, referring to FIG. 15, after the doped material 105*b* is formed, a planarization process is performed, and the doped member 105 is formed within the recess 104*b*. In some embodiments, the planarization process includes a grinding process, a chemical mechanical polishing (CMP) process, an etching process, another applicable process, or a combination thereof. In some embodiments, a top surface 105*a* of the doped member 105 is substantially coplanar with a top surface 106*c* of the second insulating layer 106*b*.

Figure 16:
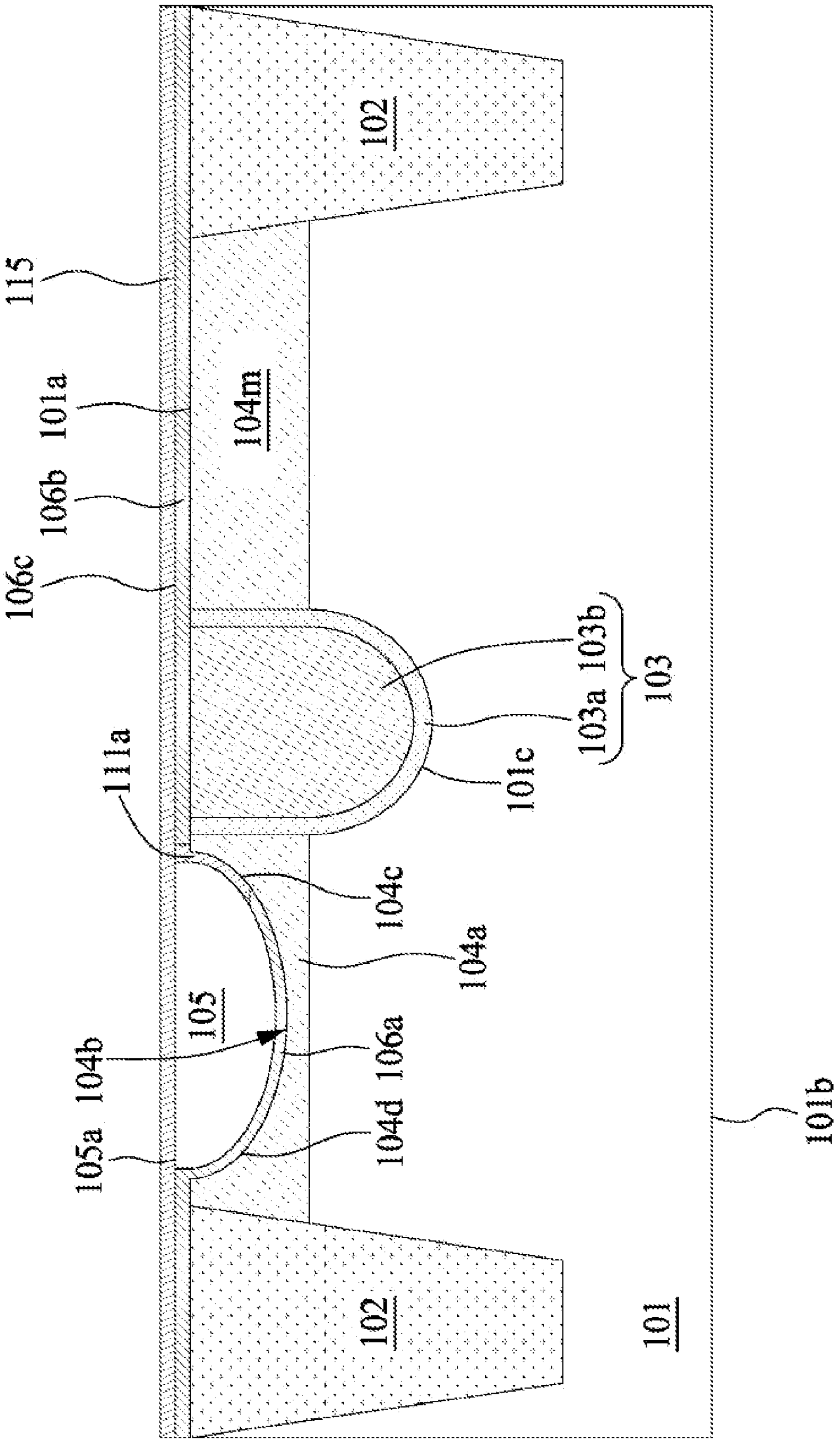
Figure 17:
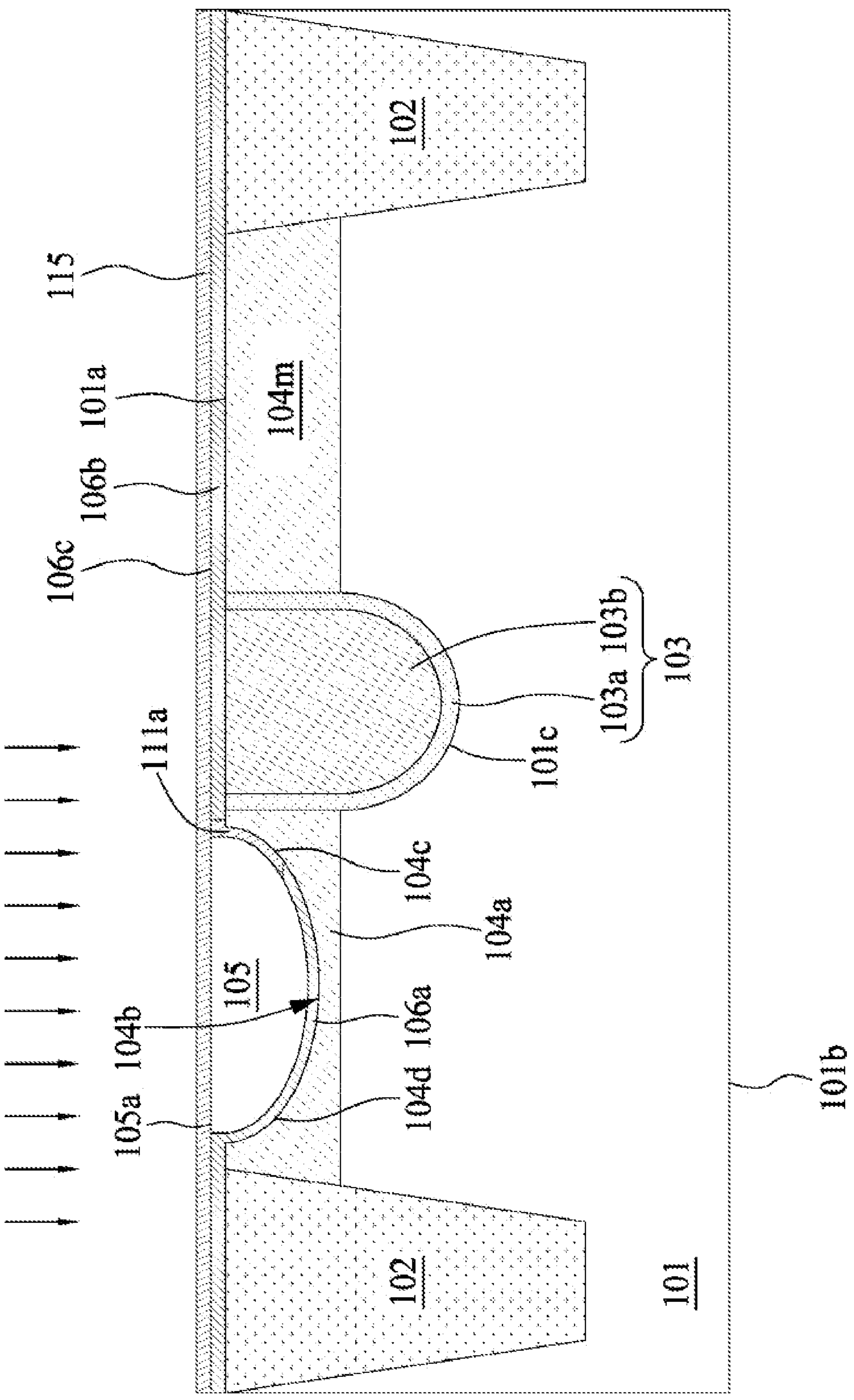
Figure 18:
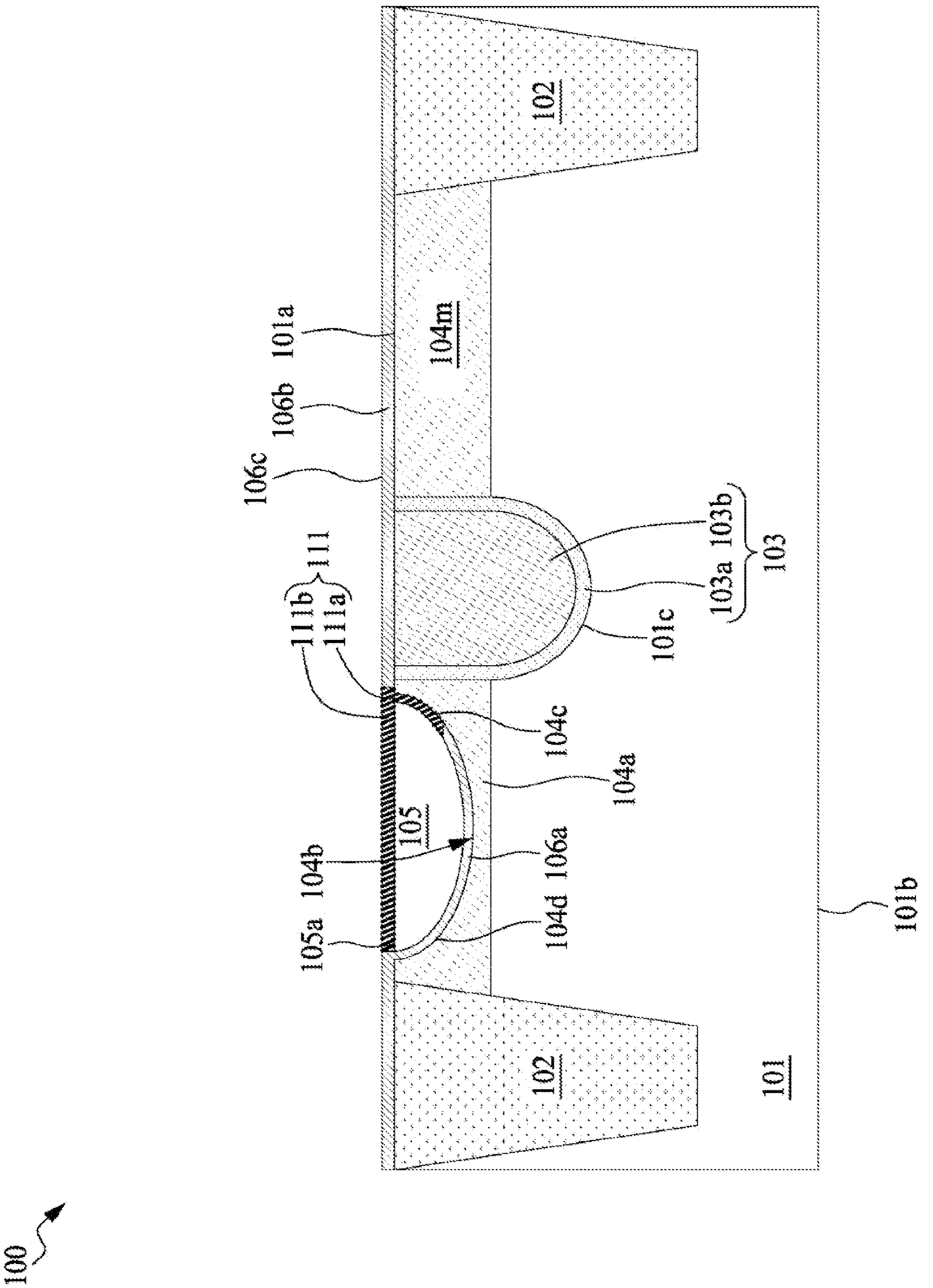

Referring to FIGS. 16 to 18, a second portion 111*b* of the conductive layer 111 is formed over the doped member 105 in accordance with step S308 in FIG. 3, wherein the second portion 111*b* of the conductive layer 111 is coupled to the first portion 111*a* of the conductive layer 111.

In some embodiments, referring to FIG. 16, a second conductive material 115 is disposed over the doped member 105, the first insulating layer 106*a*, and the second insulating layer 106*b*. In some embodiments, the second conductive material 115 is coupled to the first portion 111*a* of the conductive layer 111. In some embodiments, the second conductive material 115 includes the second portion 111*b* of the conductive layer 111 disposed over the doped member 105. In some embodiments, the second conductive material 115 is formed by a chemical vapor deposition (CVD) process, a physical vapor deposition (PVD) process, an atomic layer deposition (ALD) process or any other suitable process. In some embodiments, the second conductive material 115 includes cobalt.

In some embodiments, referring to FIG. 17, the second portion 111*b* of the conductive layer 111 is annealed. In some embodiments, the second conductive material 115 is annealed. In some embodiments, the second portion 111*b* of the conductive layer 111 is annealed at a temperature between 650° C. and 800° C. In some embodiments, the second conductive material 115 reacts with the doped member 105. In some embodiments, the second conductive material 115 includes $CoSiO_2$.

In some embodiments, referring to FIG. 18, the second conductive material 115 disposed on the second insulating layer 106*b* and the isolation structure 102 is removed, and the second portion 111*b* of the conductive layer 111 is formed on the doped member 105 and coupled to the first portion 111*a* of the conductive layer 111. In some embodiments, the formation of the second portion 111$b$ of the conductive layer 111 is performed after the formation of the first portion 111$a$ of the conductive layer 111 and the formation of the doped member 105. In some embodiments, a top surface of the second portion 111$b$ of the conductive layer 111 is substantially coplanar with a top surface 106$c$ of the second insulating layer 106$b$. In some embodiments, the first memory device 100 is formed.

In some embodiments, the second conductive material 115 disposed on the second insulating layer 106$b$ and the isolation structure 102 is removed by etching or any other suitable process. In some embodiments, the second conductive material 115 disposed on the second insulating layer 106$b$ and the isolation structure 102 is washed away by a dilute hydrofluoric acid solution (DHF).

Figure 19:
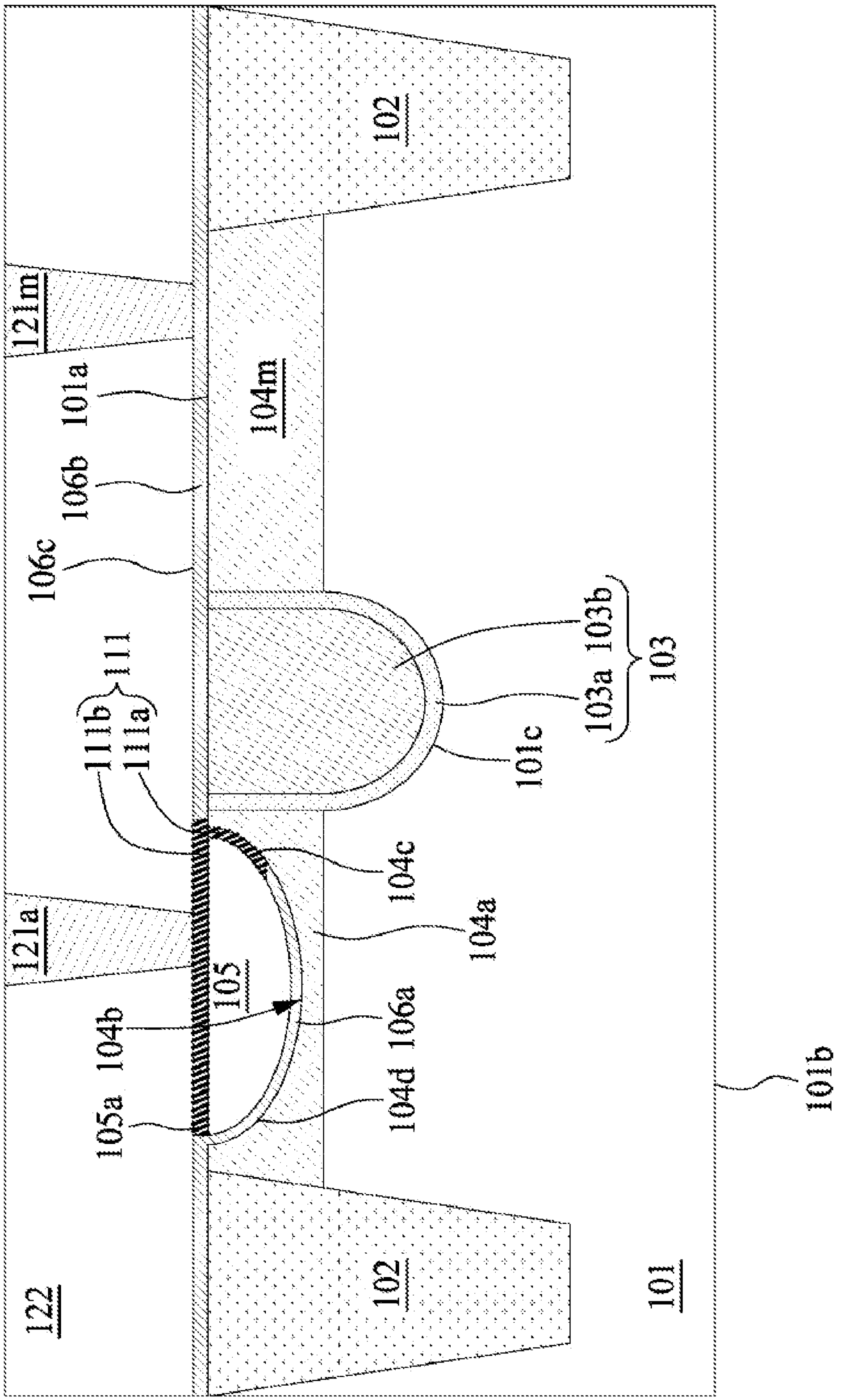

In some embodiments, referring to FIG. 19, the method S300 further includes forming a first dielectric layer 122 over the conductive layer 111, the first insulating layer 106$a$ and the second insulating layer 106$b$. In some embodiments, the first dielectric layer 122 is formed by a chemical vapor deposition (CVD) process, a physical vapor deposition (PVD) process, an atomic layer deposition (ALD) process, a spin-coating process, or another applicable process. After the first dielectric layer 122 is formed, contacts 121$a$, 121$m$ are formed within the first dielectric layer 122, and a planarization process may be selectively performed. The contact 121$a$ is coupled to the second portion 111$b$ of the conductive layer 111 and surrounded by the first dielectric layer 122. The contact 121$m$ is coupled to the second active region 104$m$ and surrounded by the first dielectric layer 122 and the second insulating layer 106$b$. In some embodiments, the planarization process includes a grinding process, a chemical mechanical polishing (CMP) process, an etching process, another applicable process, or a combination thereof. In some embodiments, the contacts 121$a$, 121$m$ include conductive material.

Figure 20:
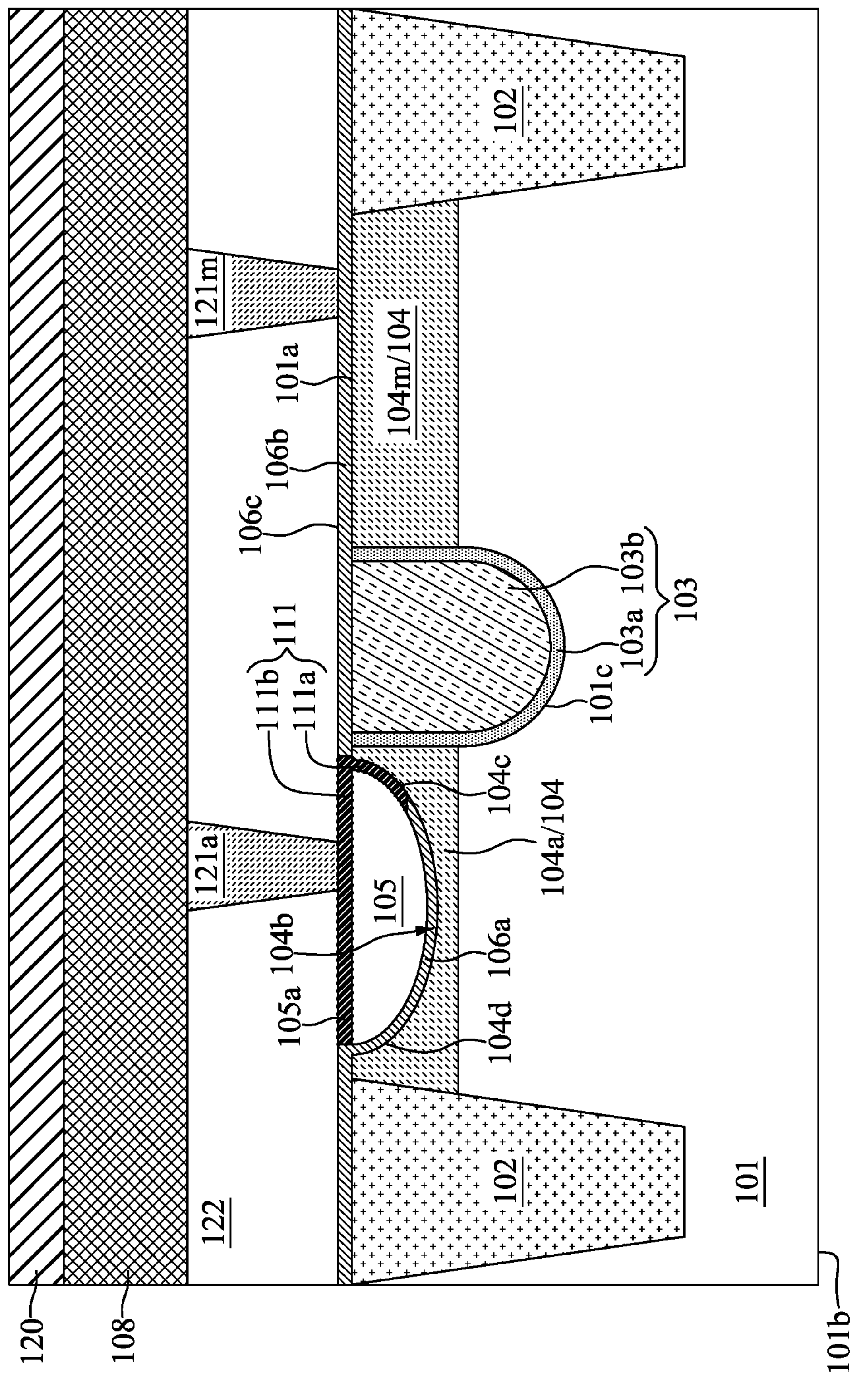
Figure 21:
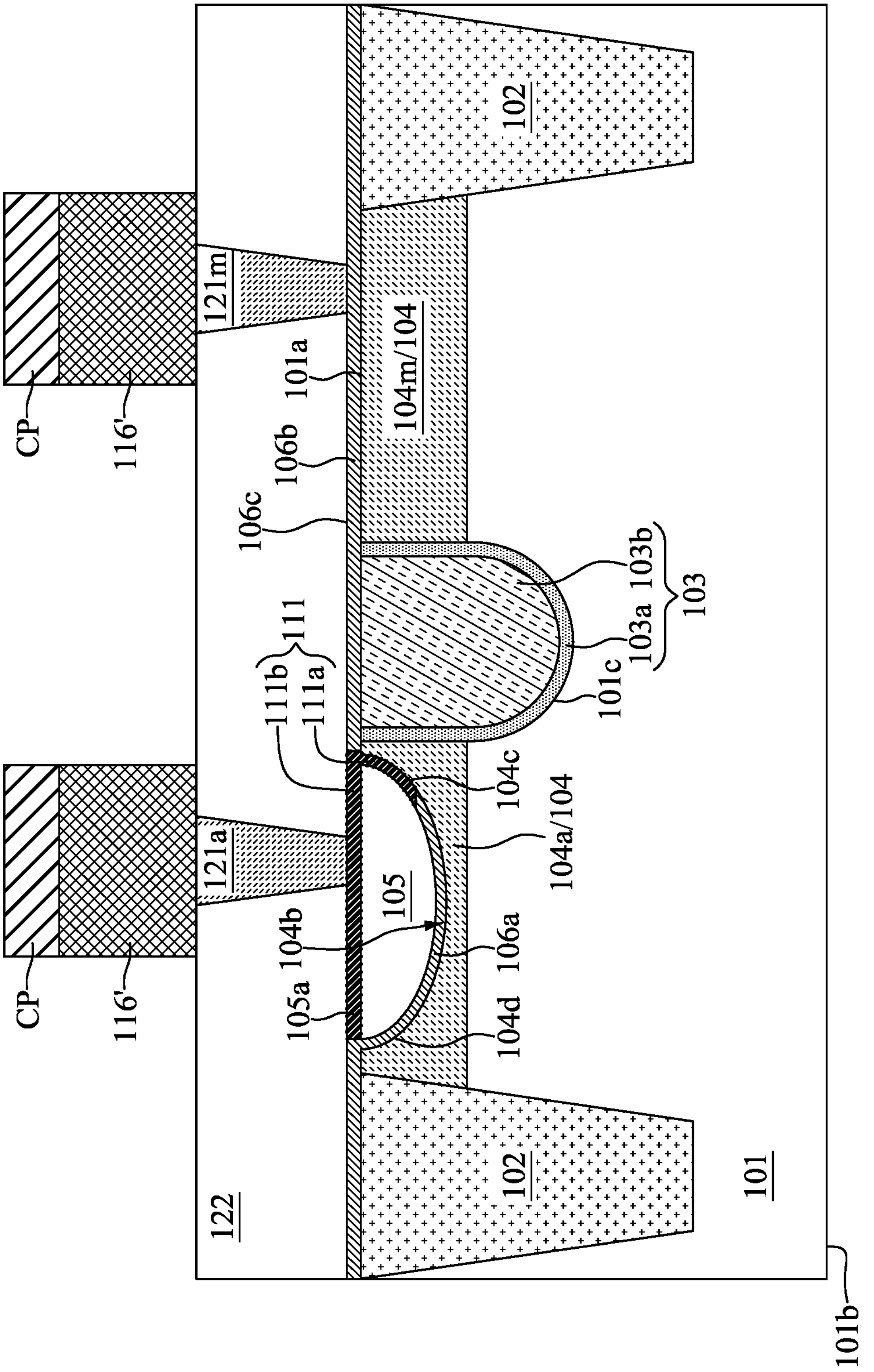
Figure 22:
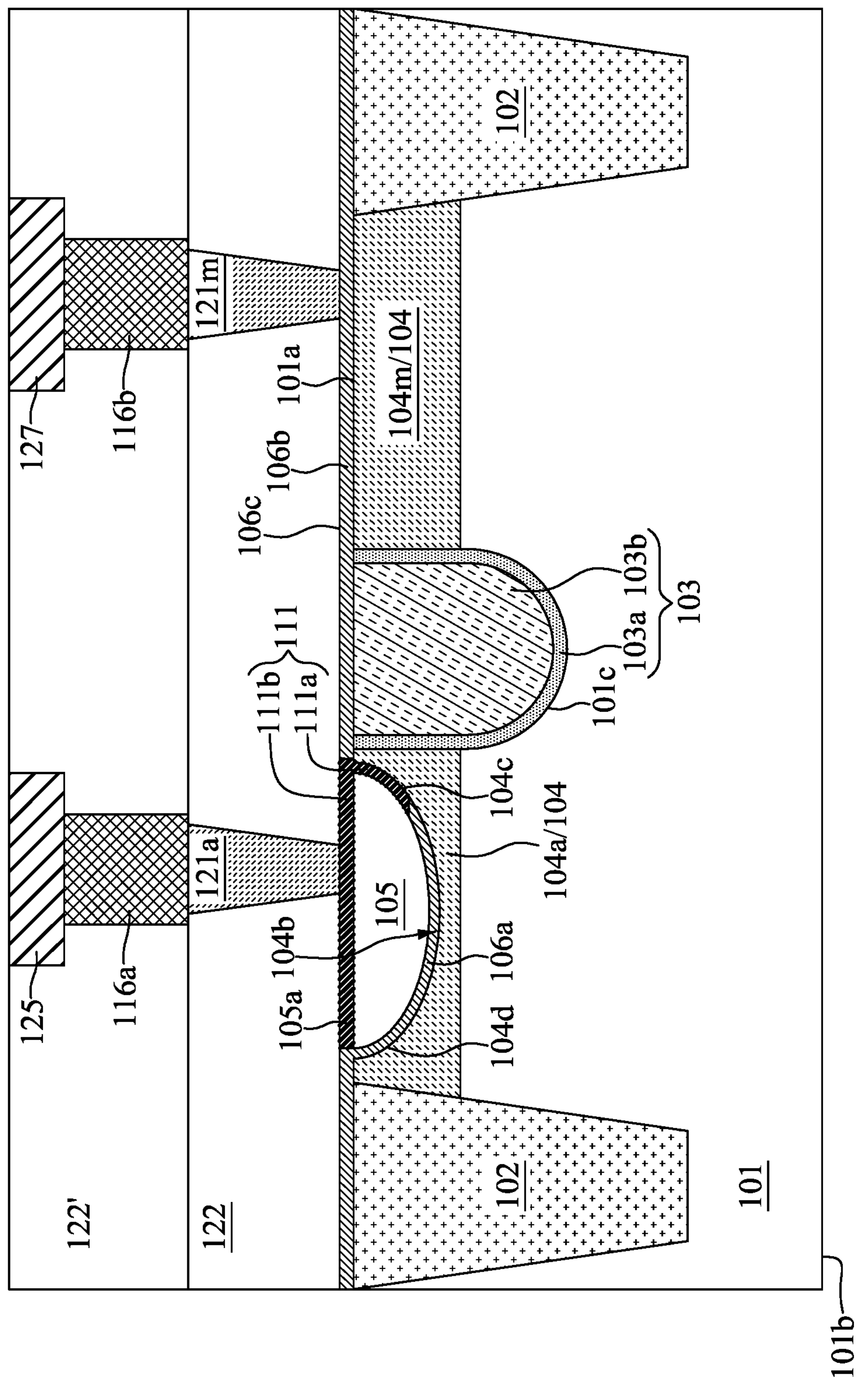

Referring to FIGS. 20 to 22, in some embodiments, the method S300 further includes forming a second dielectric layer 122' over the first dielectric layer 122. In some embodiments, after the second dielectric layer 122' is formed, a landing pad 125 and conductive pillars 116$a$, 116$b$ are formed within the second dielectric layer 122'.

In some embodiments, referring to FIG. 20, first and second conductive layers 108, 120 are globally formed on the current structure. In other words, the contacts 121$a$, 121$m$ and the first dielectric layer 122 may be covered by the first and second conductive layers 108, 120. The second conductive layer 120 is stacked on the first conductive layer 108. In some embodiments, the first conductive layer 108 consists of multiple layers that include same or different conductive materials. In some embodiments, the first conductive layer 108 has a thickness greater than a thickness of the second conductive layer 120. In addition, in some embodiments, a conductive material for forming the second conductive layer 120 has a resistivity less than a resistivity of the conductive material for forming the first conductive layer 108, and the conductive material for forming the first conductive layer 108 has an etching selectivity with respect to the conductive material that is sufficient for forming the second conductive layer 120. A method for forming each of the conductive layers 108, 120 may include a deposition process (e.g., a PVD process), a plating process, or a combination thereof.

In some embodiments, referring to FIG. 21, the first and second conductive layers 108, 120 are patterned to form initial conductive pillars 116' and the landing pads CP. During such patterning, portion of the first and second conductive layers 108, 120 are removed, and portions of the first dielectric layer 122 may be exposed. Sidewalls of the formed initial conductive pillars 116' may be substantially coplanar with sidewalls of the formed landing pads CP. In other words, a footprint area of each of the initial conductive pillars 116' may be substantially identical to a footprint area of the overlying contact pad CP. In some embodiments, a method for forming the initial conductive pillar 116' and the contact pad CP may include a lithography process and an anisotropic etching process (e.g., a dry etching process).

In some embodiments, referring to FIG. 22, the initial conductive pillars 116' are laterally recessed to form the conductive pillars 116$a$, 116$b$, while a landing pad 125 and a bit line 127 are formed after the contact pads CP are etched. In some embodiments, a method for laterally recessing the initial conductive pillars 116' includes an isotropic etching process (e.g., a wet etching process). In those embodiments where the conductive material for forming the landing pad 125 and the bit line 127 has an etching selectivity with respect to the conductive material that is sufficient for forming the conductive pillars 116$a$, 116$b$, the contact pad CP may avoid being damaged (or may be only slightly consumed) during such isotropic etching process. As a consequence, the formed conductive pillars 116$a$, 116$b$ can be laterally recessed with respect to the landing pads 125 and the bit lines 127. After the isotropic etching process, the conductive pillar 116$a$ and the landing pad 125, and the conductive pillar 116$b$ and the bit line 127, form T-shaped stacked structures on the contacts 121$a$, 121$m$. In some embodiments, a dielectric layer 122' is formed overlying and surrounding the T-shaped stacked structures. In some embodiments, a method for forming the dielectric layer 122' includes a deposition process (e.g., a CVD process), and may further include a planarization process for removing excess material above the landing pads 125 and the bit lines 127.

Figure 23:
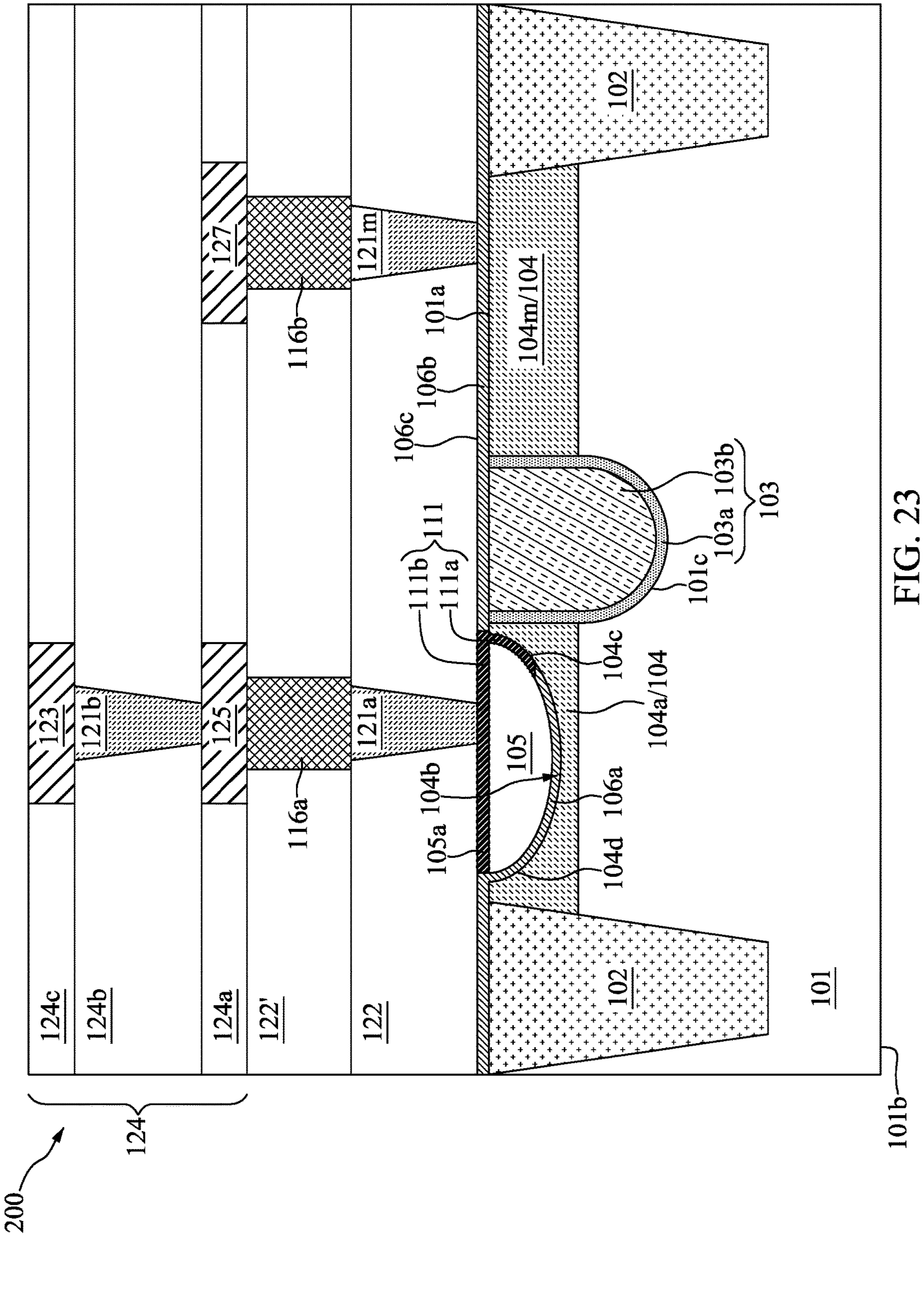

In some embodiments, referring to FIG. 23, the method S300 further includes forming a third dielectric layer 124 over the second dielectric layer 122'. In some embodiments, portions of the second dielectric layer 122' are removed and thus the landing pad 125, the bit line 127, and other portions of the second dielectric layer 122' are exposed. In some embodiments, a plurality of sub-layers 124$a$, 124$b$, 124$c$ of the third dielectric layer 124 are formed over the second dielectric layer 122'. In some embodiments, a material of the third dielectric layer 124 is different from a material of the second dielectric layer 122' such that an etching selectivity of the third dielectric layer 124 with respect to the second dielectric layer 122' is high during subsequent processing. In some embodiments, the third dielectric layer 124 is formed by a chemical vapor deposition (CVD) process, a physical vapor deposition (PVD) process, an atomic layer deposition (ALD) process, a spin-coating process, or another applicable process. After the third dielectric layer 124 is formed, the landing pad 125 and the bit line 127 are enclosed by the third dielectric layer 124. In some embodiments, a contact 121$b$ and a capacitor 123 are formed within the third dielectric layer 124 and over the landing pad 125. In some embodiments, a planarization process may be selectively performed. In some embodiments, the planarization process includes a grinding process, a chemical mechanical polishing (CMP) process, an etching process, another applicable process, or a combination thereof. In some embodiments, the capacitor 123 is coupled to the contacts 121$a$, 121$b$, the conductive pillar 116$a$ and the landing pad 125. In some embodiments, the bit line 127 is coupled to the contact 121$m$ and the conductive pillar 116$b$. In some embodiments, the contact 121*m*, the capacitor 123, the landing pad 125, the bit line 127, the conductive pillar 116*a* and the conductive pillar 116*b* include conductive material.

Figure 24:
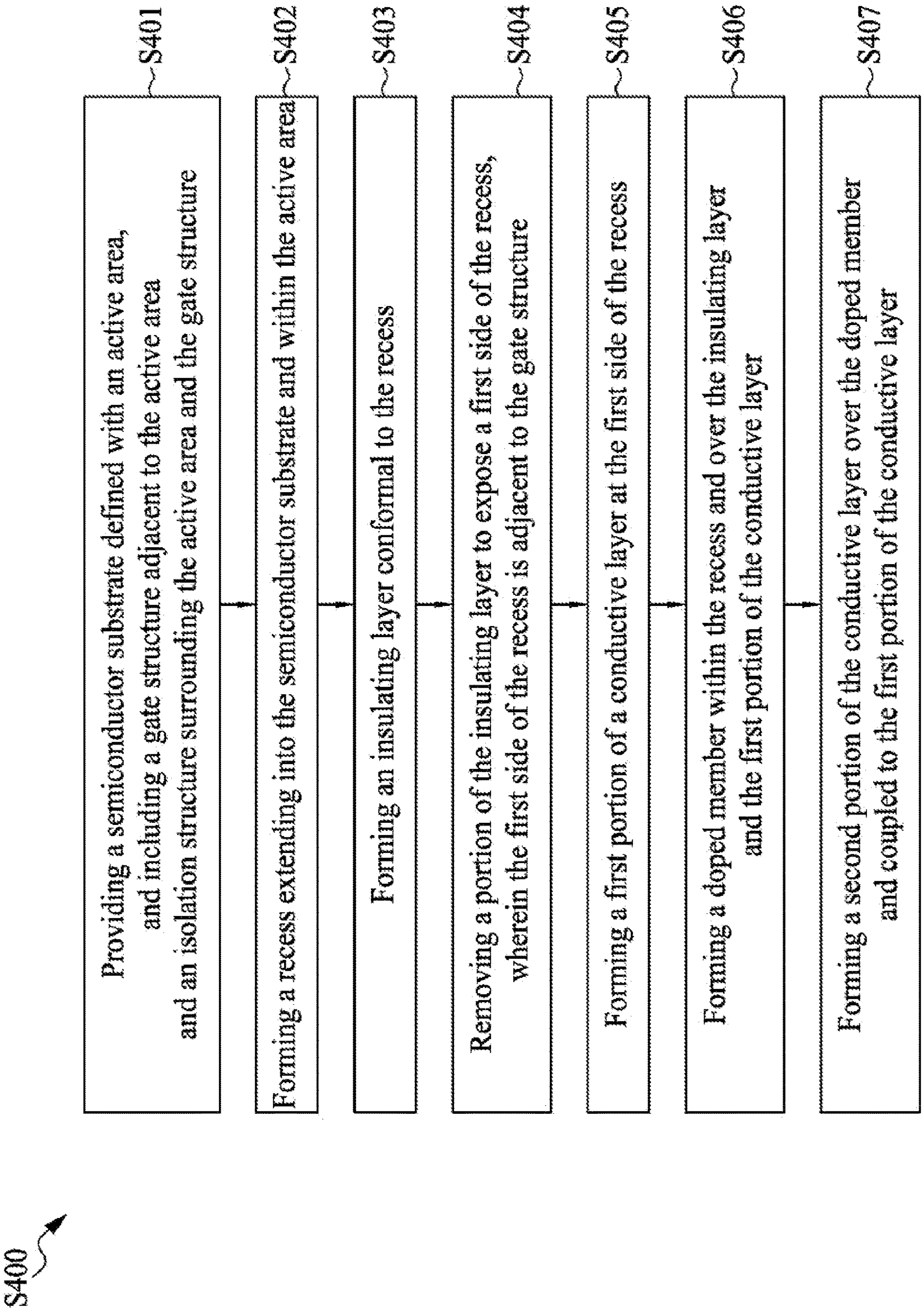
FIGS. 24 and 25 are a flow diagram illustrating a method of manufacturing a memory device in accordance with some embodiments of the present disclosure.
Figure 25:
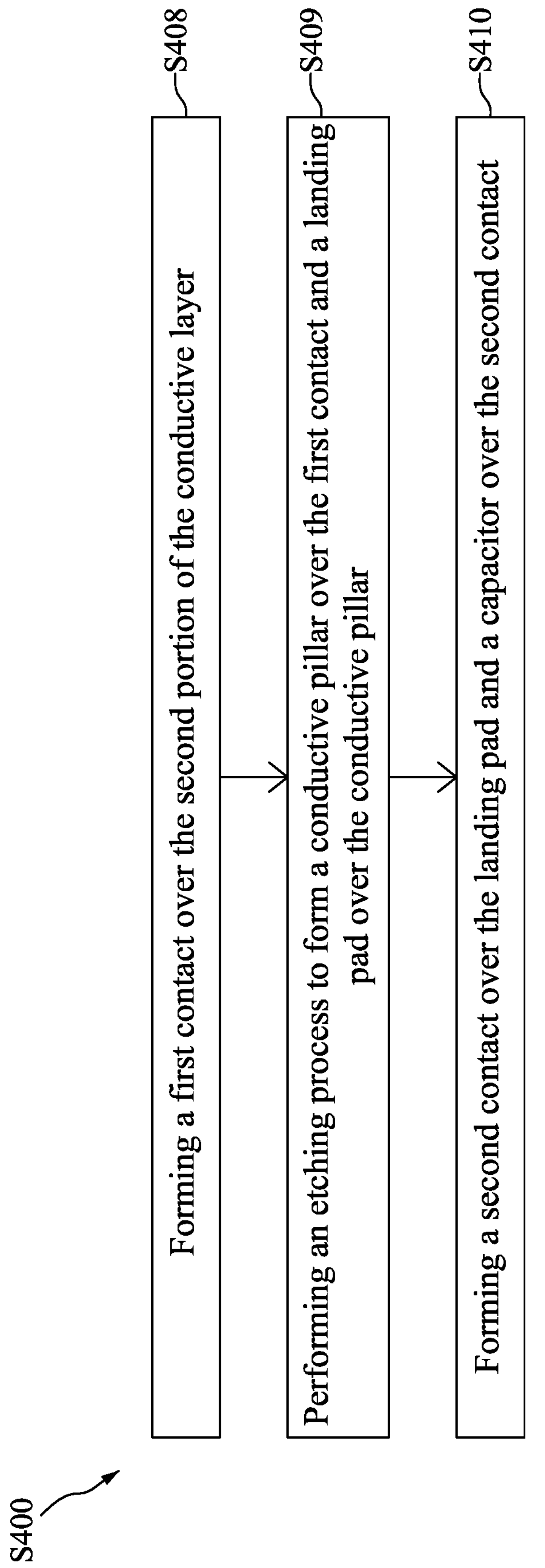

FIGS. 24, 25 are a flow diagram illustrating a method S400 of manufacturing the first memory device 100 or the second memory device 200 in accordance with some embodiments of the present disclosure.

The method S400 includes a number of operations, and description and illustration are not deemed as a limitation to a sequence of the operations. The method S400 includes a number of steps (S401, S402, S403, S404, S405, S406, S407, S408, S409 and S410).

In some embodiments, a semiconductor substrate is provided in accordance with step S401 in FIG. 24. In some embodiments, the semiconductor substrate is defined with an active area, and includes a gate structure adjacent to the active area and an isolation structure surrounding the active area and the gate structure. In some embodiments, a recess extending into the semiconductor substrate and within the active area is formed in accordance with step S402 in FIG. 24. In some embodiments, an insulating layer conformal to the recess is formed in accordance with step S403 in FIG. 24.

In some embodiments, in accordance with step S404 in FIG. 24, a portion of the insulating layer is removed to expose a first side of the recess, wherein the first side of the recess is adjacent to the gate structure. In some embodiments, a first portion of a conductive layer is formed on the first side of the recess in accordance with step S405 in FIG. 24. In some embodiments, a doped member is formed within the recess and over the insulating layer and the first portion of the conductive layer in accordance with step S406 in FIG. 24. In some embodiments, a second portion of the conductive layer is formed over the doped member and coupled to the first portion of the conductive layer in accordance with step S407 in FIG. 24.

In some embodiments, in accordance with step S408 in FIG. 25, a first contact is formed over the second portion of the conductive layer. In some embodiments, an etching process is performed to form a conductive pillar over the first contact, and a landing pad over the conductive pillar, in accordance with step S409 in FIG. 25. In some embodiments, the etching process includes a first etching process and a second etching process. In some embodiments, the first etching process is an anisotropic etching, and the second etching process is an isotropic etching.

In some embodiments, in accordance with step S410 in FIG. 25, a second contact is formed over the landing pad and a capacitor is formed over the second contact.

In an aspect of the present disclosure, a memory device is provided. The memory device includes a semiconductor substrate having a first surface and defined with an active area under the first surface; a gate structure adjacent to the active area and indented into the semiconductor substrate from the first surface; a doped member extending into the semiconductor substrate and surrounded by the active area; a conductive layer including a first portion extending into the semiconductor substrate from the first surface and a second portion disposed over the doped member and coupled to the first portion; a first insulating layer disposed adjacent to the first portion of the conductive layer and between the doped member and the active area of the semiconductor substrate; a first contact disposed over the conductive layer and surrounded by a first dielectric layer; and a conductive pillar disposed over the first contact and disposed between the first contact and a capacitor, wherein the first portion of the conductive layer is disposed between the gate structure and the doped member.

In some embodiments, the first portion of the conductive layer is in contact with the doped member. In some embodiments, the gate structure includes a gate electrode and a gate oxide surrounding the gate electrode. In some embodiments, the doped member is disposed between the first insulating layer and the second portion of the conductive layer. In some embodiments, the doped member is surrounded by the first insulating layer and the conductive layer. In some embodiments, the first portion of the conductive layer is in contact with the doped member.

In some embodiments, the conductive layer is disposed over the active area. In some embodiments, the first portion of the conductive layer is coupled to the first insulating layer. In some embodiments, the first portion of the conductive layer is substantially orthogonal to the second portion of the conductive layer. In some embodiments, the first contact is disposed between the conductive pillar and the conductive layer. In some embodiments, the conductive pillar is a single-layer structure or multi-layer structure. In some embodiments, the memory device further comprises a landing pad disposed over the conductive pillar.

In some embodiments, the landing pad and the conductive pillar are made of different conductive materials. In some embodiments, a resistivity of the landing pad is less than a resistivity of the first conductive pillar. In some embodiments, the memory device further comprises a second contact disposed over the landing pad and disposed between the capacitor and the landing pad. In some embodiments, the capacitor is electrically connected to the active area through the second contact, the landing pad, the conductive pillar, the first contact and the conductive layer.

In another aspect of the present disclosure, a memory device is provided. The memory device includes a semiconductor substrate defined with a first active area and a second active area; a gate structure adjacent to the first and second active areas and indented into the semiconductor substrate from a first surface of the semiconductor substrate; a doped member extending into the semiconductor substrate and surrounded by the first active area; a conductive layer including a first portion extending into the semiconductor substrate from the first surface of the semiconductor substrate and a second portion disposed over the doped member and coupled to the first portion; a first insulating layer disposed adjacent to the first portion of the conductive layer and between the doped member and the first active area of the semiconductor substrate, and a second insulating layer disposed over the gate structure, wherein the first insulating layer and the second insulating layer are separated from each other; a first contact and a second contact disposed over the conductive layer and surrounded by a first dielectric layer; and a first conductive pillar and a second conductive pillar disposed over the first dielectric layer, wherein the first portion of the conductive layer is disposed between the gate structure and the doped member.

In some embodiments, the gate structure includes a gate electrode and a gate oxide surrounding the gate electrode. In some embodiments, the doped member is disposed between the first insulating layer and the second portion of the conductive layer. In some embodiments, the doped member is surrounded by the conductive layer and the insulating layer.

In some embodiments, the first portion of the conductive layer is in contact with the doped member. In some embodiments, the conductive layer is disposed over the first active area and the second active area. In some embodiments, the first portion of the conductive layer is coupled to the first insulating layer. In some embodiments, the first contact is disposed between the first conductive pillar and the conductive layer, and the second contact is disposed between the second conductive pillar and the second insulating layer.

In some embodiments, each of the first and second conductive pillars forms a single-layer structure or a multi-layer structure. In some embodiments, the memory device further comprises a landing pad disposed over the first conductive pillar. In some embodiments, the memory device further comprises a bit line disposed over the second conductive pillar. In some embodiments, the landing pad, the bit line and the first and second conductive pillars are made of different conductive materials. In some embodiments, resistivities of the landing pad and the bit line are less than resistivities of the first and second conductive pillars. In some embodiments, the memory device further comprises a third contact disposed over the landing pad and disposed between the first capacitor and the landing pad. In some embodiments, the first capacitor is electrically connected to the first active area through the third contact, the landing pad, the first conductive pillar, the first contact and the conductive layer.

In another aspect of the present disclosure, a method for preparing a memory device is provided. The method includes steps of providing a semiconductor substrate defined with an active area and including a gate structure adjacent to the active area and an isolation structure surrounding the active area and the gate structure; forming a recess extending into the semiconductor substrate and within the active area; and forming an insulating layer conformal to the recess. The method further includes removing a portion of the insulating layer to expose a first side of the recess, wherein the first side of the recess is adjacent to the gate structure; forming a first portion of a conductive layer on the first side of the recess; forming a doped member within the recess and over the insulating layer and the first portion of the conductive layer; forming a second portion of the conductive layer over the doped member and coupled to the first portion of the conductive layer; forming a first contact over the second portion of the conductive layer; performing an etching process to form a conductive pillar over the first contact and a landing pad over the conductive pillar; and forming a second contact over the landing pad and a capacitor over the second contact.

In some embodiments, the etching process includes a first etching process and a second etching process. In some embodiments, the first etching process is an anisotropic etching, and the second etching process is an isotropic etching.

In some embodiments, the landing pad and the conductive pillar are made of different materials. In some embodiments, a resistivity of the landing pad is less than a resistivity of the conductive pillar.

In conclusion, because an insulating layer is configured to limit a P-N junction area within an active area, a current must pass through a conductive layer coupled to the insulating layer, and P-N junction leakage can therefore be avoided. An overall performance of the memory device and a process of manufacturing the memory device are thereby improved.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device, comprising:

a semiconductor substrate defined with a first active area and a second active area;

a gate structure adjacent to the first and second active areas and indented into the semiconductor substrate from a first surface of the semiconductor substrate;

a doped member extending into the semiconductor substrate and surrounded by the first active area;

a conductive layer, including a first portion extending into the semiconductor substrate from the first surface of the semiconductor substrate and a second portion disposed over the doped member and coupled to the first portion;

a first insulating layer disposed adjacent to the first portion of the conductive layer and between the doped member and the first active area of the semiconductor substrate, and a second insulating layer disposed over the gate structure, wherein the first insulating layer and the second insulating layer are separated from each other;

a first contact and a second contact surrounded by a first dielectric layer, wherein the first contact is disposed on the first portion and the second portion of the conductive layer, wherein the second contact is disposed over the second active region; and a first conductive pillar and a second conductive pillar disposed over the first dielectric layer, wherein the first portion of the conductive layer is disposed between the gate structure and the doped member;

wherein the second portion of the conductive layer is disposed over the first active area and the second insulating layer is disposed over the second active area.

2. The memory device according to claim 1, wherein the first portion of the conductive layer is coupled to the first insulating layer.

3. The memory device according to claim 1, wherein the first contact is disposed between the first conductive pillar and the conductive layer, and the second contact is disposed between the second conductive pillar and the second insulating layer.

4. The memory device according to claim 1, wherein each of the first and second conductive pillars forms a single-layer structure or a multi-layer structure.

5. The memory device according to claim 1, further comprising a landing pad disposed over the first conductive pillar.

6. The memory device according to claim 1, further comprising a bit line disposed over the second conductive pillar.

7. The memory device according to claim 6, wherein the landing pad, the bit line and the first and second conductive pillars are made of different conductive materials.

8. The memory device according to claim 7, wherein resistivities of the landing pad and the bit line are less than resistivities of the first and second conductive pillars.

9. The memory device according to claim 7, further comprising a third contact disposed over the landing pad and disposed between the first capacitor and the landing pad.

10. The memory device according to claim 9, wherein the capacitor is electrically connected to the first active area through the third contact, the landing pad, the first conductive pillar, the first contact and the conductive layer.

* * * * *